United States Patent
Deng

(10) Patent No.: US 8,760,927 B2
(45) Date of Patent: Jun. 24, 2014

(54) EFFICIENT STATIC RANDOM-ACCESS MEMORY LAYOUT

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 229 days.

(21) Appl. No.: 13/558,003

(22) Filed: Jul. 25, 2012

(65) Prior Publication Data

US 2013/0182495 A1 Jul. 18, 2013

Related U.S. Application Data

(60) Provisional application No. 61/587,477, filed on Jan. 17, 2012.

(51) Int. Cl.
*G11C 11/34* (2006.01)

(52) U.S. Cl.
USPC .......... 365/185.18; 365/185.27; 365/156

(58) Field of Classification Search
USPC ............... 365/185.18, 156, 185.27
See application file for complete search history.

(56) References Cited

U.S. PATENT DOCUMENTS 8,031,532 B2 * 10/2011 Shum et al. .......... 365/185.27

OTHER PUBLICATIONS

Boselli et al., "Latch-up in 65nm CMOS Technology: A Scaling Perspective", 43rd Annual International Reliability Physics Symposium (IEEE, 2005), pp. 137-144.
U.S. Appl. No. 13/467,517, filed May 9, 2012, entitled "Method of Screening Static Random Access Memory Cells for Positive Bias Temperature Instability".

* cited by examiner

*Primary Examiner* — Son Dinh
*Assistant Examiner* — Nam Nguyen
(74) *Attorney, Agent, or Firm* — Rose Alyssa Keagy; Wade J. Brady, III; Frederick J. Telecky, Jr.

(57) ABSTRACT

A complementary metal-oxide-semiconductor (CMOS) static random access memory (SRAM) with no well contacts within the memory array. Modern sub-micron CMOS structures have been observed to have reduced vulnerability to latchup. Chip area is reduced by providing no well contacts within the array. Wells of either or both conductivity types may electrically float during operation of the memory. In other implementations, extensions of the array wells into peripheral circuitry may be provided, with well contacts provided in those extended portions.

25 Claims, 14 Drawing Sheets

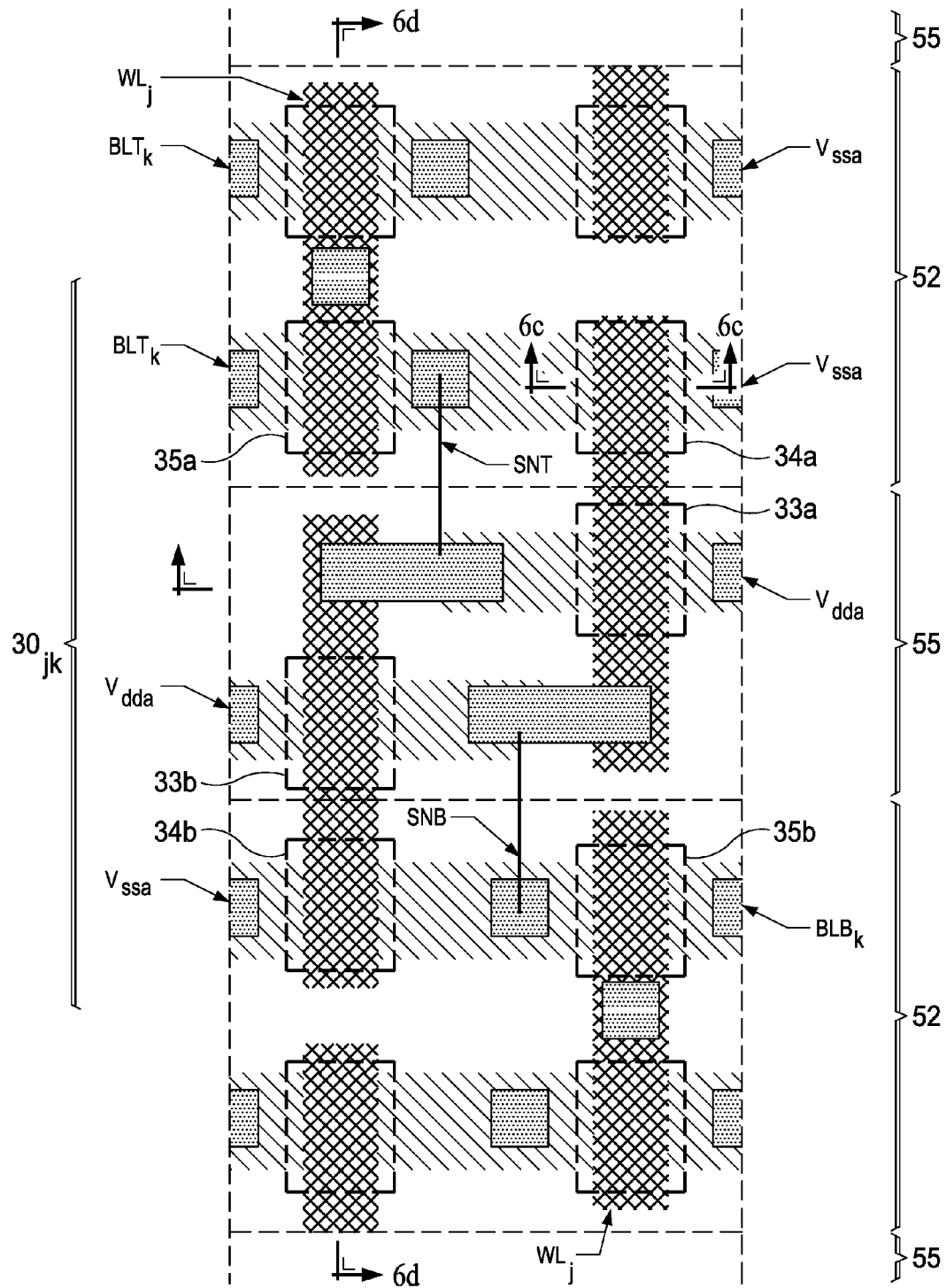

EFFICIENT STATIC RANDOM-ACCESS MEMORY LAYOUT

CROSS-REFERENCE TO RELATED APPLICATIONS

This application claims priority, under 35 U.S.C. §119(e), of Provisional Application No. 61/587,477, filed Jan. 17, 2012, incorporated herein by this reference.

STATEMENT REGARDING FEDERALLY SPONSORED RESEARCH OR DEVELOPMENT

Not applicable.

BACKGROUND OF THE INVENTION

Many modern electronic devices and systems now include substantial computational capability for controlling and managing a wide range of functions and useful applications. Considering the large amount of digital data often involved in performing the complex functions of these modern devices, significant solid-state memory capacity is now commonly implemented in the electronic circuitry for these systems. Static random access memory (SRAM) has become the memory technology of choice for much of the solid-state data storage requirements in these modern power-conscious electronic systems. As is fundamental in the art, SRAM cells store contents "statically", in that the stored data state remains latched in each cell so long as power is applied to the memory; this is in contrast to "dynamic" RAM ("DRAM"), in which the data must be periodically refreshed in order to be retained.

Advances in semiconductor technology in recent years have enabled the shrinking of minimum device feature sizes (e.g., MOS transistor gates) into the sub-micron range. This miniaturization is especially beneficial when applied to memory arrays, because of the large proportion of the overall chip area often devoted to on-chip memories. As a result, significant memory resources are now often integrated as embedded memory into larger-scale integrated circuits, such as microprocessors, digital signal processors, and "system-on-a-chip" integrated circuits.

An example of a conventional SRAM cell is shown in FIG. 1. In this example, SRAM cell 2 is a conventional six-transistor (6-T) static memory cell 2, which in this case is in the $j^{th}$ row and $k^{th}$ column of a memory array. SRAM memory cell 2 is biased between the voltage on power supply line $V_{dda}$ and a ground reference voltage $V_{ssa}$. SRAM memory cell 2 is constructed in the conventional manner as a pair of cross-coupled complementary MOS (CMOS) inverters, one inverter of series-connected p-channel load transistor 3a and n-channel driver transistor 4a, and the other inverter of series-connected p-channel load transistor 3b and n-channel transistor 4b; the gates of the transistors in each inverter are connected together and to the common drain node of the transistors in the other inverter, in the usual manner. The common drain node of transistors 3a, 4a constitutes storage node SNT, and the common drain node of transistors 3b, 4b constitutes storage node SNB, in this example. N-channel pass-gate transistor 5a has its source/drain path connected between storage node SNT and bit line $BLT_k$ for the $k^{th}$ column, and n-channel pass-gate transistor 5b has its source/drain path connected between storage node SNB and bit line $BLB_k$. The gates of pass-gate transistors 5a, 5b are driven by word line $WL_j$ for this $j^{th}$ row in which cell 2 resides.

In operation, bit lines $BLT_k$, $BLB_k$ are typically precharged by precharge circuitry 7 to a high voltage $V_{ddp}$ (which is at or near power supply voltage $V_{dda}$) and are equalized to that voltage; precharge circuitry 7 then releases bit lines $BLT_k$, $BLB_k$ to then float during the remainder of the access cycle. To access cell 2 for a read operation, word line $WL_j$ is then energized, turning on pass-gate transistors 5a, 5b, and connecting storage nodes SNT, SNB to bit lines $BLT_k$, $BLB_k$. The differential voltage developed on bit lines $BLT_k$, $BLB_k$ is then sensed and amplified by a sense amplifier. In a write operation, typical modern SRAM memories include write circuitry that pulls one of bit lines $BLT_k$, $BLB_k$ low (i.e., to a voltage at or near ground voltage $V_{ssa}$), depending on the data state to be written. Upon word line $WL_j$ then being energized, the low level bit line $BLT_k$ or $BLB_k$ will pull down its associated storage node SNT, SNB, causing the cross-coupled inverters of addressed cell 2 to latch in the desired state.

As known for years in the art, CMOS structures such as memory arrays including CMOS SRAM cell 2 and the like are inherently vulnerable to a condition known as "latchup". Integrated circuits that incorporate p-channel and n-channel MOS field-effect transistors (MOSFETs) near one another necessarily include adjacent regions of n-type and p-type doped silicon, in which a parasitic p-n-p-n structure is present. Those alternating adjacent p-n-p-n regions can operate as a "thyristor", or silicon-controlled rectifier ("SCR"), circuit in which an n-p-n bipolar transistor is paired with a p-n-p bipolar transistor in a feedback arrangement.

FIG. 2a is an electrical schematic of a well-known SCR circuit, based on p-n-p bipolar transistor 10 and n-p-n bipolar transistor 12. In this case, the emitter of transistor 10 is connected to the anode of the SCR, its base is connected to the collector of transistor 12 and, via resistor 13, to power supply voltage $V_{dd}$. The base of transistor 12 is connected to the collector of transistor 10 and, via resistor 11, to ground $V_{ss}$. The emitter of transistor 12 is connected to the cathode of the SCR. In operation, power supply voltage $V_{dd}$ is biased positive relative to ground $V_{ss}$. If the base-emitter junction of transistor 10 becomes forward-biased, due to a sufficiently high voltage at anode A, transistor 10 conducts current into the base of transistor 12, forward-biasing its base-emitter junction and causing conduction that flows into the base of transistor 10. Either of transistors 10, 12 can initiate this conduction. This positive feedback results in a relatively large current conducted between anode A and cathode C. As known in the art, the positive feedback effect is so rapid that a "snapback" in the current-voltage characteristic at the anode, appearing as "negative resistance" as the anode current continues to increase as the anode voltage decreases. So long as the anode voltage remains above a certain voltage (i.e., the "hold" voltage), the SCR will conduct a relatively large current.

As mentioned above, conventional CMOS integrated circuits inherently include p-n-p-n structures, potentially giving rise to a parasitic SCR. If such a parasitic SCR in a CMOS structure were to turn on, the integrated circuit would consume massive current as compared with its nominal operating current consumption, causing either operating failure in the integrated circuit or, in the worst case, an overcurrent condition that destroys the integrated circuit. FIG. 2b illustrates a cross-section of a typical conventional CMOS structure, such as may be encountered in an array of SRAM cells 2, and in which a parasitic SCR resides.

The structure of FIG. 2b is constructed according to a twin-well technology, with n-type well 16 and p-type well 18 disposed at the surface of p-type substrate 14. N-type well 16 is a relatively lightly-doped region into which p-channel MOS transistors are formed; conversely, p-type well 18 is a relatively lightly-doped region into which n-channel MOS transistors are formed. Shallow trench isolation dielectric structures 15 define several active regions of the surface of wells 16, 18, each of which includes a relatively heavily-doped region at the surface. In this example, n-well 16 includes heavily-doped n+ region 17n and heavily-doped p+ region 17p, and p-well 18 includes heavily-doped n+ region 19n and heavily-doped p+ region 19p. As known in the art, heavily-doped regions 17n, 19p are within wells 16, 18, respectively, of the same conductivity type and thus serve as well contacts (n+ region 17n at power supply voltage $V_{dd}$ and p+ region 19p at ground $V_{ss}$). In this construction, p+ region 17p corresponds to the emitter of p-n-p transistor 10 in the parasitic SCR, n+ region 19n corresponds to the emitter of lateral n-p-n transistor 12, n+ region 17n is the base contact of transistor 10 and the collector contact of transistor 12, and p+ region 19p is the base contact of transistor 12 and the collector contact of transistor 10. Resistor 11 of the parasitic SCR is constituted by the lateral resistance of well 18 and substrate 14, and resistor 13 is the lateral resistance of well 16.

Considering this construction, latchup of the CMOS structure of FIG. 2b can occur in various ways. One typical latchup event is the coupling of noise of sufficient magnitude to either (or both) of the emitter nodes at p+ region 17p and n+ region 19n. Because of the junction capacitance of regions 17p, 19n, dV/dt current may be induced from the noise event and injected into the base of one of transistors 10, 12, respectively. If the lateral resistance of the corresponding resistor 11, 13 is too high, the base-emitter junction of the transistor 10, 12 receiving the injection current can forward bias, initiating base current in the opposite parasitic device that, through the positive feedback mechanism described above, results in the latched-up state with large current conducted from anode A (p+ region 17p) to cathode C (n+ region 19n).

The risk of latchup in conventional CMOS integrated circuits is minimized by ensuring that well contacts are present at a sufficient spatial frequency. These well contacts ensure that the base-emitter junctions of the parasitic bipolar transistors in the structure are not significantly forward-biased. For the structure of FIG. 2b, frequent n+ regions 17n within n-wells 16 for receiving power supply voltage $V_{dd}$ effectively reduce the well resistance (resistor 13), which reduces the voltage drop across that well resistance caused by the noise-induced current, thus keeping the base-emitter voltage of parasitic p-n-p transistor 10 below its forward bias threshold. Frequent p+ regions 19p within p-wells 18 similarly reduce the effective well or substrate resistance (resistor 11), preventing the base-emitter junction of parasitic n-p-n transistor 12 from becoming significantly forward biased.

FIG. 3 illustrates the layout of memory array 20 (or, alternatively, one memory array block of a multiple-block memory array 20, as the case may be) in a conventional integrated circuit. In this example, memory array 20 includes two half-arrays 22, each of which contain a number of SRAM cells 2 arranged in rows and columns. Because SRAM cells 2 are realized as CMOS circuits, as described above, at least one well region (e.g., an n-well containing p-channel transistors 3a, 3b) is provided within half-arrays 22. In twin-well technologies, as shown in FIG. 2a, well contacts are made to both n-wells 16 and p-wells 18. As shown in FIG. 3, dummy cell rows 23 are provided on opposite ends of memory array 20. These dummy cell rows 23 are constructed similarly as SRAM cells 2 within half-arrays 22, but are not connected or otherwise operable as memory cells. Dummy cell rows 23 are instead provided to maintain photolithographic regularity for the outermost cells 2 in half-arrays 22, as conventional for integrated circuits realized by sub-micron feature sizes.

In this conventional layout of FIG. 3, strap row 24 is disposed between half-arrays 22 as shown. Strap row 24 contains "top-side" well contacts to either or both of n-wells 16 and p-wells 18, to which overlying metal conductors route the appropriate power supply or ground voltages (e.g., voltages $V_{dd}$, $V_{ss}$, etc.) to those well regions. In this arrangement, in which strap row 24 runs vertically (in the view of FIG. 3), wells 16, 18 would run horizontally (in the view of FIG. 3), to minimize the distance within wells 16, 18 from a well contact. It is contemplated that, of course, additional strap rows 24 may be necessary within memory array 20, depending on the particular layout and manufacturing parameters, and also on the size of memory array 20. For example, n-wells and p-wells within memory array 20 are commonly biased from well contacts within the area of dummy cell rows 23. These well region contacts cause dummy cell rows 23 to be larger than would be necessary if only dummy memory cells were realized within those rows.

Of course, chip area is required for the realization of each strap row 24 within memory array 20, and for each dummy cell row 23 of sufficient size to accommodate well region contacts. Particularly in those integrated circuits with substantial chip area already consumed by multiple instances of memory array 20, the provision of one or more strap rows 24 within each memory array 20 to avoid latchup can amount to a significant cost. It has also been observed that conventional well contacts, and thus conventional strap rows 24 and dummy cell rows 23, do not scale with reductions in gate level feature sizes (i.e., transistor gate widths), considering that these well contacts tend to be defined by metal conductor pitch, rather than by gate level features. Therefore, as minimum feature sizes continue to be reduced by advances in photolithography and other processing technologies, the fraction of the overall chip area consumed in order to make well region contacts for the array grows. In some modern integrated circuits including memory arrays 20, a chip area penalty for array well region contacts of as high as 3% has been observed at the current state-of-the-art technology node.

By way of further background, Boselli et al., "Latch-up in 65 nm CMOS Technology: A Scaling Perspective", 43$^{rd}$ *Annual International Reliability Physics Symposium* (IEEE, 2005), pp. 137-44, incorporated herein by reference, describes the behavior of latchup tendencies over the 180 nm, 130 nm, 90 nm, and 65 nm "technology nodes" (i.e., the typical distance between identical features in adjacent memory cells in an array for a given manufacturing technology). As described in that paper, latchup susceptibility appears to decrease as feature sizes shrink. In particular, as the technology scales to smaller features, the latchup feedback loop appears to weaken, the voltage differential between the SCR "hold" voltage and the power supply voltage (e.g., $V_{dd}$) appears to increase, and the temperature dependence of the onset of latchup appears to decrease. All of these observed tendencies indicate that the latchup condition is becoming more difficult to trigger and sustain as CMOS technology scales over time.

By way of further background, copending and commonly assigned U.S. application Ser. No. 13/467,517, filed May 9, 2012, and entitled "Method of Screening Static Random Access Memory Cells for Positive Bias Temperature Instability", describes SRAM memory cells in which the n-channel transistors are formed within p-wells that are isolated from p-type semiconductor material in peripheral circuitry of the memory and other functions in the integrated circuit. This construction enables forward and reverse body node bias voltages to be applied to the isolated p-wells of the SRAM cells under test to determine whether such operations as read disturb, or write cycles, disrupt the cells under such bias.

BRIEF SUMMARY OF THE INVENTION

Embodiments of this invention provide a solid-state memory, and methods of operating and fabricating the same, that may be realized in reduced integrated circuit chip area.

Embodiments of this invention provide such a memory and methods in which the chip area reduction is attained without increasing the risk of latchup in complementary metal-oxide-semiconductor (CMOS) structures.

Embodiments of this invention provide such a memory and methods in which the chip area reduction is attained without significantly impacting transistor performance.

Embodiments of this invention provide such a memory and methods in which steady-state transistor leakage is reduced.

Other objects and advantages of embodiments of this invention will be apparent to those of ordinary skill in the art having reference to the following specification together with its drawings.

Embodiments of this invention may be implemented into a CMOS memory array constructed according to either a single-well or double-well technology, in which no well contacts are provided within the bounds of the memory array itself. This implementation takes advantage of the recognition that modern deep sub-micron CMOS structures exhibit much less vulnerability to latchup than larger transistors; in addition, it has been observed that the threshold voltage of high-k metal-gate transistors is generally insensitive to body node bias. As such, the wells in the memory array may be allowed to electrically float. Alternatively, well bias may be made to memory array wells at extensions of those wells outside of the memory array, considering that the distance between the well contacts and cells within the array is not a significant factor in preventing latchup for these technologies.

BRIEF DESCRIPTION OF THE SEVERAL VIEWS OF THE DRAWING

FIG. 2b is a cross-sectional view of a conventional CMOS structure including the parasitic SCR of FIG. 2a.

FIG. 6b is a plan view.

DETAILED DESCRIPTION OF THE INVENTION

The present invention will be described in connection with its preferred embodiment, for example as implemented into an array of static random access memory (SRAM) cells implemented according to complementary metal-oxide-semiconductor (CMOS) technology, as it is contemplated that this invention will be especially beneficial when implemented in such an application. However, it is further contemplated that this invention may provide benefit when applied in other types of integrated circuits, including other types of memories such as dynamic RAMs, read-only memories (ROMs), and the like, as well as in other types of integrated circuits. Accordingly, it is to be understood that the following description is provided by way of example only, and is not intended to limit the true scope of this invention as claimed.

Figure 4:
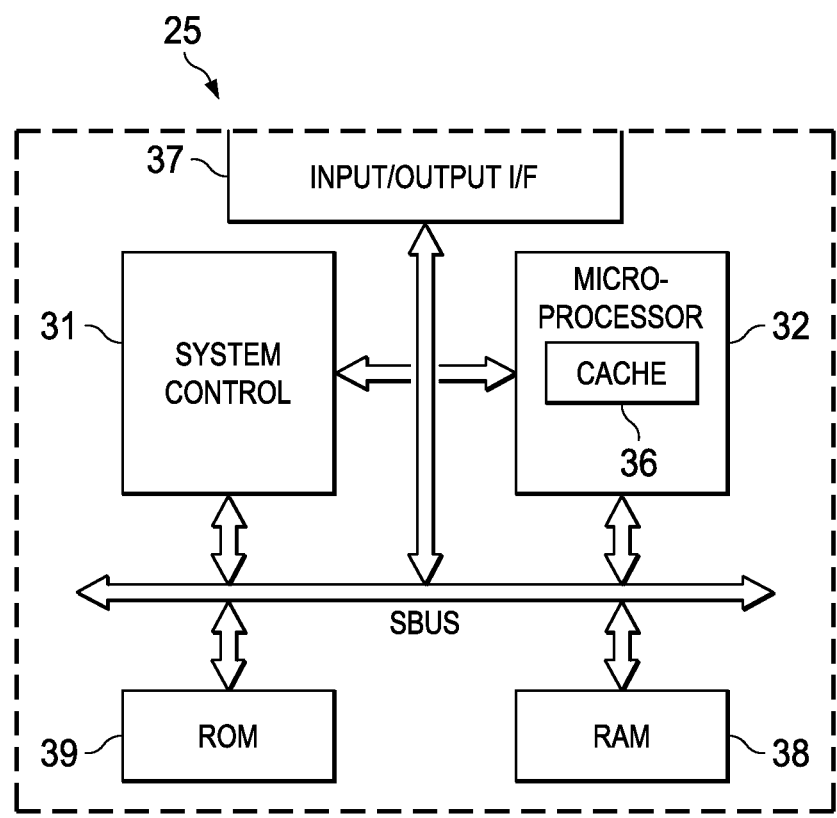
FIG. 4 is an electrical diagram, in block form, of an integrated circuit constructed according to embodiments of this invention.

FIG. 4 illustrates an example of large-scale integrated circuit 25, in the form of a so-called "system-on-a-chip" ("SoC"), as now popular in many electronic systems. Integrated circuit 25 is a single-chip integrated circuit into which an entire computer architecture is realized. As such, in this example, integrated circuit 25 includes a central processing unit of microprocessor 32, which is connected to system bus SBUS. Various memory resources, including random access memory (RAM) 38 and read-only memory (ROM) 39, reside on system bus SBUS and are thus accessible to microprocessor 32. In many modern implementations, ROM 39 is realized by way of electrically erasable programmable read-only memory (EEPROM), a common type of which is referred to as "flash" EEPROM. As will be described in further detail below, realization of at least part of ROM 39 as flash EEPROM can facilitate the implementation and operation of embodiments of this invention. In any case, ROM 39 typically serves as program memory, storing the program instructions executable by microprocessor 32, while RAM 38 serves as data memory; in some cases, program instructions may reside in RAM 38 for recall and execution by microprocessor 32. Cache memory 36 (such as level 1, level 2, and level 3 caches, each typically implemented as SRAM) provides another memory resource, and resides within microprocessor 32 itself and therefore does not require bus access. Other system functions are shown, in a generic sense, in integrated circuit 25 by way of system control 31 and input/output interface 37.

Those skilled in the art having reference to this specification will recognize that integrated circuit 25 may include additional or alternative functions to those shown in FIG. 4, or may have its functions arranged according to a different architecture from that shown in FIG. 4. The architecture and functionality of integrated circuit 25 is thus provided only by way of example, and is not intended to limit the scope of this invention.

Figure 5:
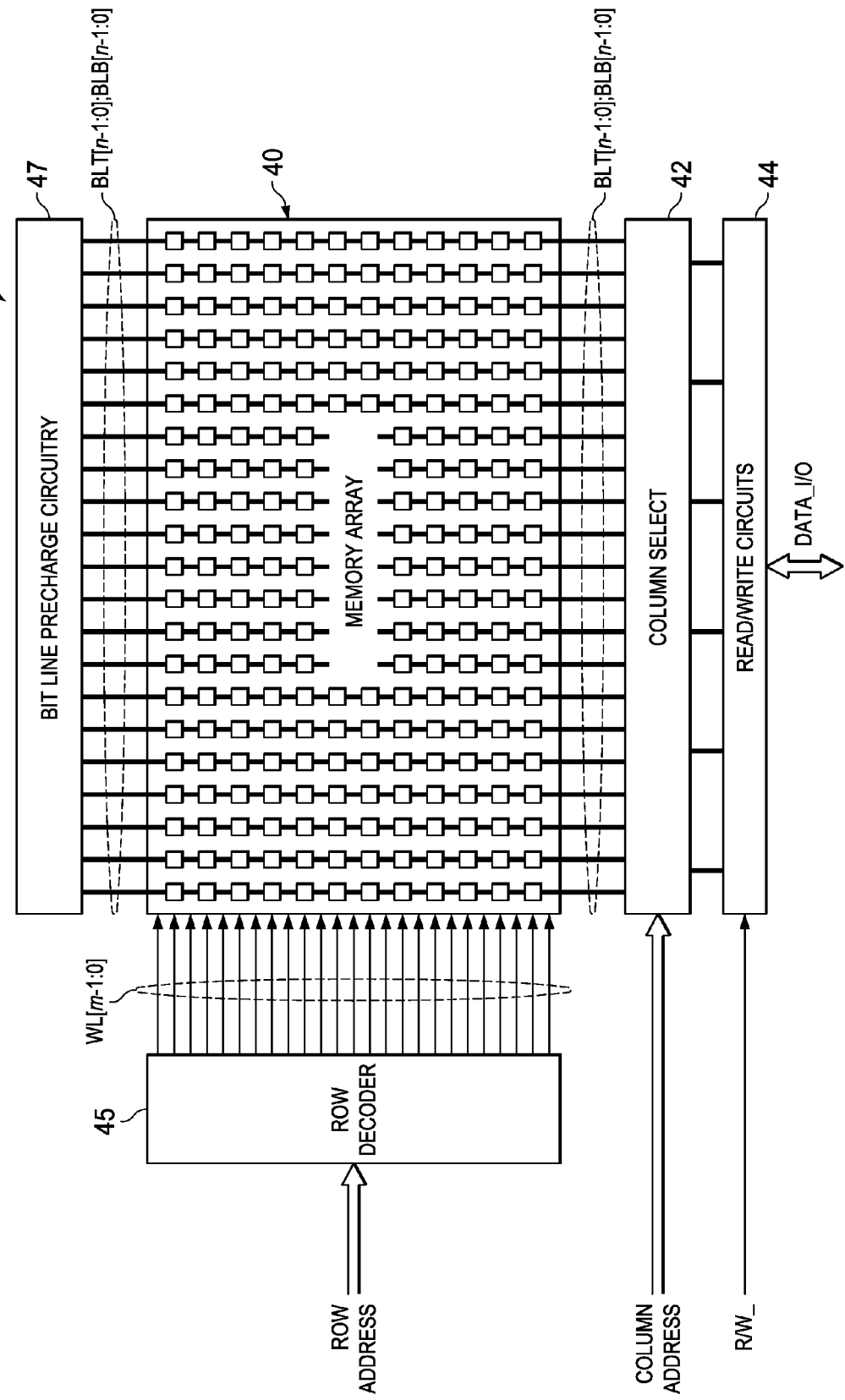
FIG. 5 is an electrical diagram, in block form, of a memory in the integrated circuit of FIG. 4 according to embodiments of this invention.

Further detail in connection with the construction of RAM 38 in integrated circuit 25 is illustrated in FIG. 5. Of course, a similar construction may be used to realize other memory resources such as cache memory 36 and ROM 39 (as applicable); further in the alternative, RAM 38 may correspond to a stand-alone memory integrated circuit (i.e., rather than as embedded memory as shown in FIG. 4). Those skilled in the art having reference to this specification will comprehend that the memory architecture of RAM 38 in FIG. 5 is provided by way of example only.

In this example, RAM 38 includes many memory cells arranged in rows and columns within memory array 40. While a single instance of memory array 40 is shown in FIG. 5, it is to be understood that RAM 38 may include multiple memory arrays 40, each corresponding to a memory block within the address space of RAM 38.

In the example shown in FIG. 5, memory array 40 includes m rows and n columns of SRAM cells, with cells in the same column sharing a pair of bit lines BLT[n−1:0], BLB[n−1:0], and with memory cells in the same row sharing one of word lines WL[m−1:0]. Bit line precharge circuitry 47 is provided to apply a desired precharge voltage to the pairs of bit lines BLT[n−1:0], BLB[n−1:0] in advance of read and write operations. Row decoder 45 receives a row address value indicating the row of memory array 40 to be accessed, and energizes the one of word lines WL[m−1:0] corresponding to that row address value. Column select circuit 42 receives a column address value, and in response selects pairs of bit lines BLT [n−1:0], BLB[n−1:0] associated with one or more columns to be placed in communication with read/write circuits 44. Read/write circuits 44 are constructed in the conventional manner, for example to include the typical differential amplifier coupled to the bit lines for a column as selected by column select circuit 42 and a write circuit for selectively pulling toward ground one of the bit lines in the selected pair. The example of RAM 38 shown in FIG. 5 is constructed to an "interleaved" architecture, in which a given memory address selects one of every x (e.g., one of every four) columns for read or write access. The data words stored in memory array 40 are thus interleaved with one another, in the sense that the memory address decoded (in part) by column select circuit 42 selects one column in each group of columns, along the selected row. Alternatively, memory array 40 may be arranged in a non-interleaved fashion, in which each cell in the selected row is coupled to a corresponding read/write circuit in each cycle. In that architecture, read/write circuits 44 could reside between bit lines BL[n−1:0], and column select circuits 42, with the column select circuits selecting which read/write circuits 44 (and thus which columns) are in communication with data bus DATA I/O.

As discussed above in connection with the Background of the Invention, modern integrated circuits are now commonly constructed with extremely small minimum sized features, for example with metal-oxide-semiconductor (MOS) transistor gates having widths deep in the sub-micron regime. As transistor feature sizes have scaled into the deep submicron realm, conventional gate dielectric layers (e.g., silicon dioxide) have become extremely thin, which can be problematic from the standpoint of manufacturing yield and reliability. In response, so-called "high-k" gate dielectrics, such as hafnium oxide ($HfO_2$), have become popular. These dielectrics have higher dielectric constants than silicon dioxide and silicon nitride, permitting those films to be substantially thicker than the corresponding silicon dioxide gate films while remaining suitable for use in high performance MOS transistors. Gate electrodes of metals and metal compounds, such as titanium nitride, tantalum-silicon-nitride, tantalum carbide, and the like are now also popular in modern MOS technology, especially in combination with high-k gate dielectrics. These metal gate electrodes eliminate effects such as polysilicon depletion, such effects being noticeable at the extremely small feature sizes required of these technologies.

As mentioned above in connection with the Boselli et al. paper, it has been observed that vulnerability of CMOS structures to latchup is reducing as device feature sizes continue to shrink.

Figure 1:
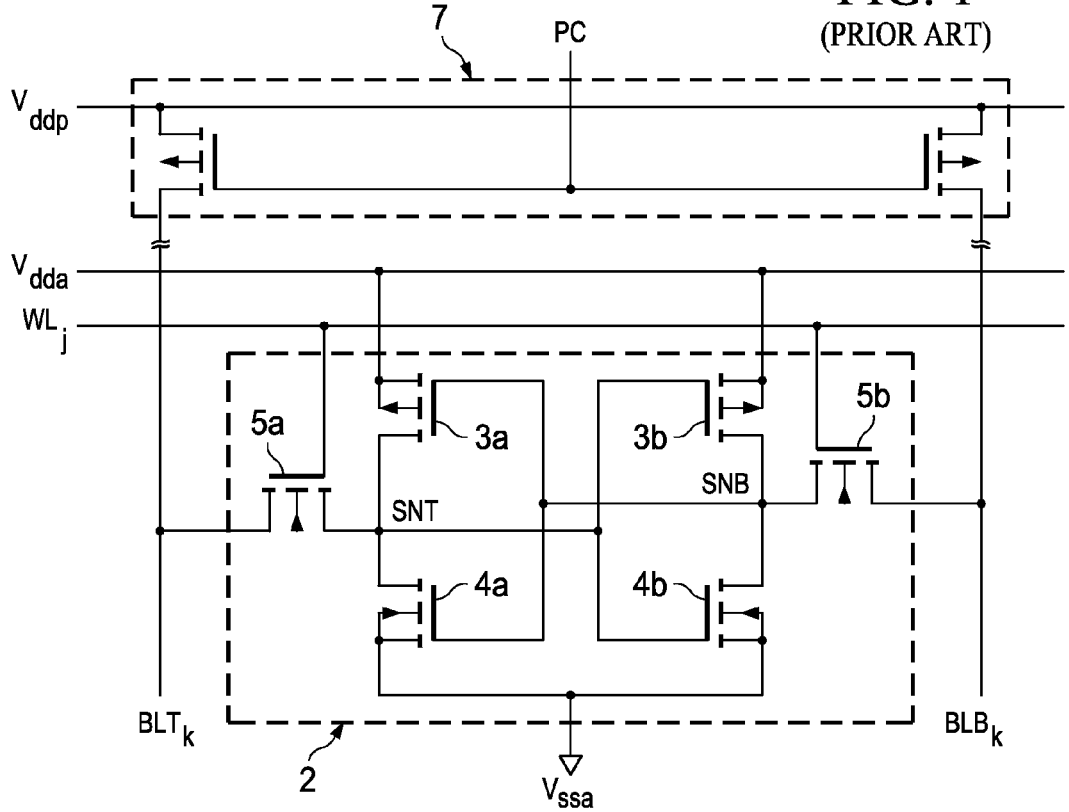
FIG. 1 is an electrical diagram, in schematic form, of a conventional 6-transistor (6-T) static random access memory (SRAM) cell.
Figure 2A:
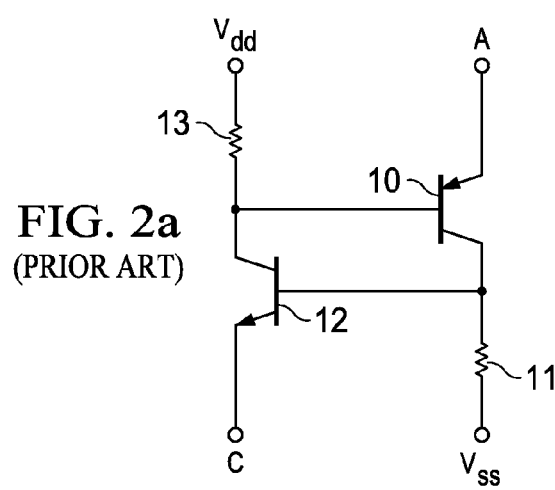
FIG. 2a is an electrical diagram, in schematic form, of a parasitic SCR present in conventional complementary metal-oxide-semiconductor (CMOS) circuits.
Figure 2B:
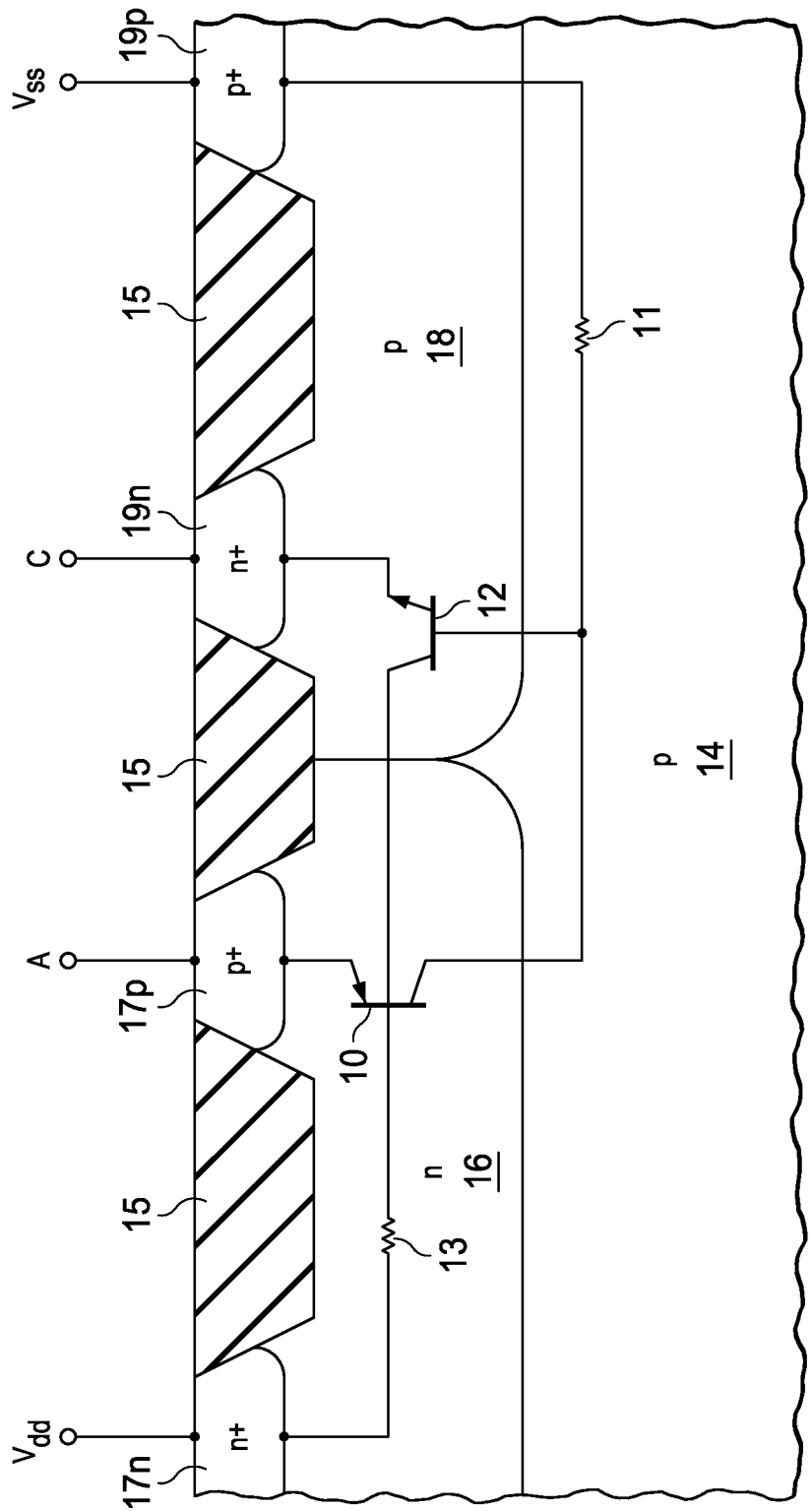

It has also been observed, in connection with this invention, that CMOS structures within memory arrays, particularly those memory arrays in which the memory cells are constructed as cross-coupled inverters tend to be less vulnerable to latchup than CMOS circuits generally. As known in the art, the switching of the data state stored by a conventional SRAM cell such as cell 2 of FIG. 1 involves the switching of one storage node from a "0" to a "1" state simultaneously with the switching of the other storage node from a "1" to a "0" state. As such, the injection of switching noise into the n-well or p-well within such a cell from a change of state of one polarity will be significantly reduced by complementary noise from the complementary change of state. The risk of latchup caused by noise injection from the cell changing state is therefore quite low. Reduced vulnerability of SRAM cells at the 65 nm CMOS technology node has been observed through actual experimentation performed in connection with this invention, even under worst case conditions for latchup vulnerability (including forward bias of the n-well). At more aggressive technology nodes, latchup test structures and SRAM cells have been observed, according to this invention, to be essentially invulnerable to single event latchup.

It has been further observed, in connection with this invention, that modern high-k metal gate MOS transistors exhibit very little threshold voltage dependence on body node voltage.

According to embodiments of this invention, therefore, memory arrays are constructed in which no well contacts are provided within the boundary of the arrays themselves. In some embodiments of the invention, one or more wells within the memory array are allowed to electrically float (i.e., are not connected to any bias voltage). In other embodiments of the invention, one or more wells within the memory array have portions that extend into neighboring peripheral circuitry, at which well contacts for biasing the wells are placed.

According to embodiments of this invention, for the case of n-type well regions, the absence of well contacts in the array is characterized by the absence, within the boundaries of the memory array, of n+ regions within each n-well to which a bias conductor makes contact, and for the case of p-type well regions, the absence, within the boundaries of the memory array, of p+ regions within each p-well to which a bias conductor makes contact. In these embodiments of the invention, the boundaries of the memory array includes the area within which memory cells are realized, and also includes the area within which "dummy" edge memory cells are realized, those dummy edge memory cells implemented to ensure that all "live" memory cells are unaffected by the photolithographic non-uniformity of peripheral circuitry adjacent to the memory array. The absence of these well contact structures reduces the necessary area required for implementation of memory arrays, without increasing the risk of latchup failure as discussed above.

While embodiments of this invention will be described in connection with MOS field-effect transistors (MOSFETs), it is to be understood that those embodiments of the invention may also be applied to junction field-effect transistors (JFETs), or to any other type of field-effect transistors (FETs).

Figure 6A:
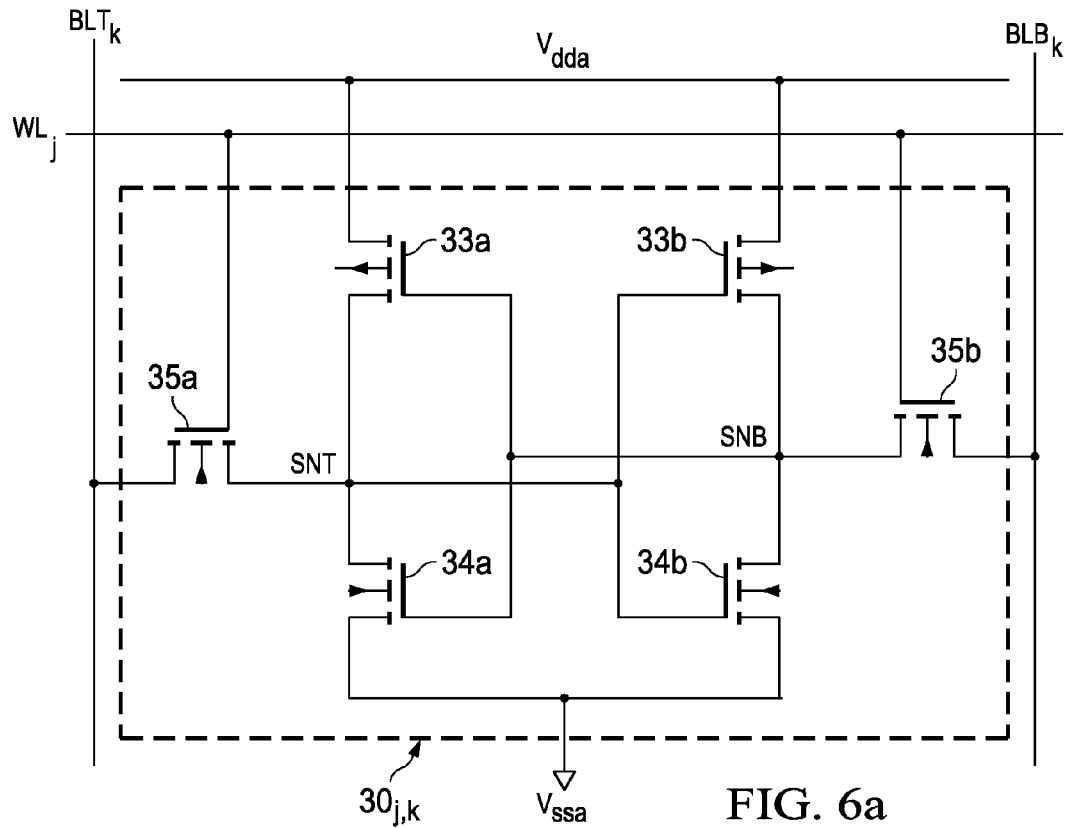
FIG. 6a is an electrical diagram, in schematic form, of a 6-T SRAM cell according to embodiments of this invention.

FIG. 6a schematically illustrates an example of the construction of memory cell $30_{jk}$ of memory array 40, according to embodiments of this invention. Cell $30_{jk}$ includes, in the conventional manner, one CMOS inverter constructed from series-connected p-channel load transistor 33a and n-channel driver transistor 34a, and another CMOS inverter of series-connected p-channel load transistor 33b and n-channel transistor 34b. The source/drain paths of transistors 33a, 34a, and also the source/drain paths of transistors 33b, 34b, are connected in series between bias conductors carrying power supply voltage $V_{dda}$ and ground voltage $V_{ssa}$. The gates of transistors 33a, 34a in one inverter are connected together and to the common drain node of transistors 33b, 34b of the opposite inverter at storage node SNB; similarly, the gates of transistors 33b, 34b are connected together and to the common drain node of transistors 33a, 34a at storage node SNT. N-channel pass-gate transistors 35a, 35b have their source/drain paths connected between storage nodes SNT, SNB, respectively, and respective bit lines $BLT_k$, $BLB_k$ for column k of array 40. Word line $WL_j$ for row j controls the gates of transistors 35a, 35b.

As will be described in further detail below, p-channel load transistors 33a, 33b of cell $30_{j,k}$ are formed within an n-well at the surface of integrated circuit 25, as is typical for modern CMOS integrated circuits. However, according to some embodiments of this invention, that n-well is allowed to electrically float, as evident by the "open" at the body nodes of transistors 33a, 33b shown in the schematic of FIG. 6a. This arrangement eliminates the need for a physical well contact (e.g., an n+ region within the n-well of transistors 33a, 33b) within the bounds of memory array 40, without increasing the latchup risk to integrated circuit 25.

Alternatively, as will also be described in further detail below, the body nodes of transistors 33a, 33b may be connected to a bias voltage (for the case of an n-well, typically to a voltage at or above power supply voltage $V_{dda}$) at a well contact outside of the boundary of memory array 40, for example within periphery circuitry adjacent to memory array 40.

In embodiments of this invention, n-channel transistors 34a, 34b, 35a, 35b of cell $30_{j,k}$ may be formed within p-type well regions, in which case no well contacts (e.g., a p+ region within that p-well) to which bias conductor make contact are provided within the bounds of memory array 40. As discussed above, these p-wells may be allowed to electrically float, or may be biased at a well contact disposed within the p-wells but outside of the bounds of memory array 40. Alternatively, n-channel transistors 34a, 34b, 35a, 35b of cell $30_{j,k}$ may be disposed at the surface of a p-type substrate, rather than within a separate p-type well region. Again, no surface well contact outside of the bounds of memory array 40 is necessary; rather, the body node and well bias will be provided to the p-type substrate from elsewhere in the integrated circuit.

Further in the alternative, if integrated circuit 25 is formed in an n-type substrate, a single well construction would provide one or more p-wells within which n-channel transistors 34, 35 for each cell $30_{jk}$ are formed, with p-channel transistors 33a, 33b formed at the surface of that n-type substrate. Of course, an n-type substrate may also support a twin-well construction, in which both p-wells and n-wells are provided within memory array 40. In any case, according to embodiments of this invention, no well contact contacted by a bias conductor is located within the bounds of memory array 40.

Figure 6C:
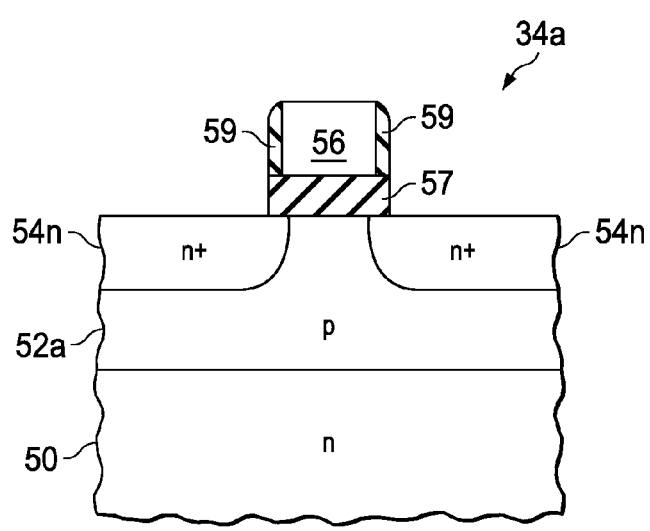
FIGS. 6c through 6e are cross-sectional views, of the SRAM cell of FIG. 6a according to embodiments of this invention.
Figure 6D:
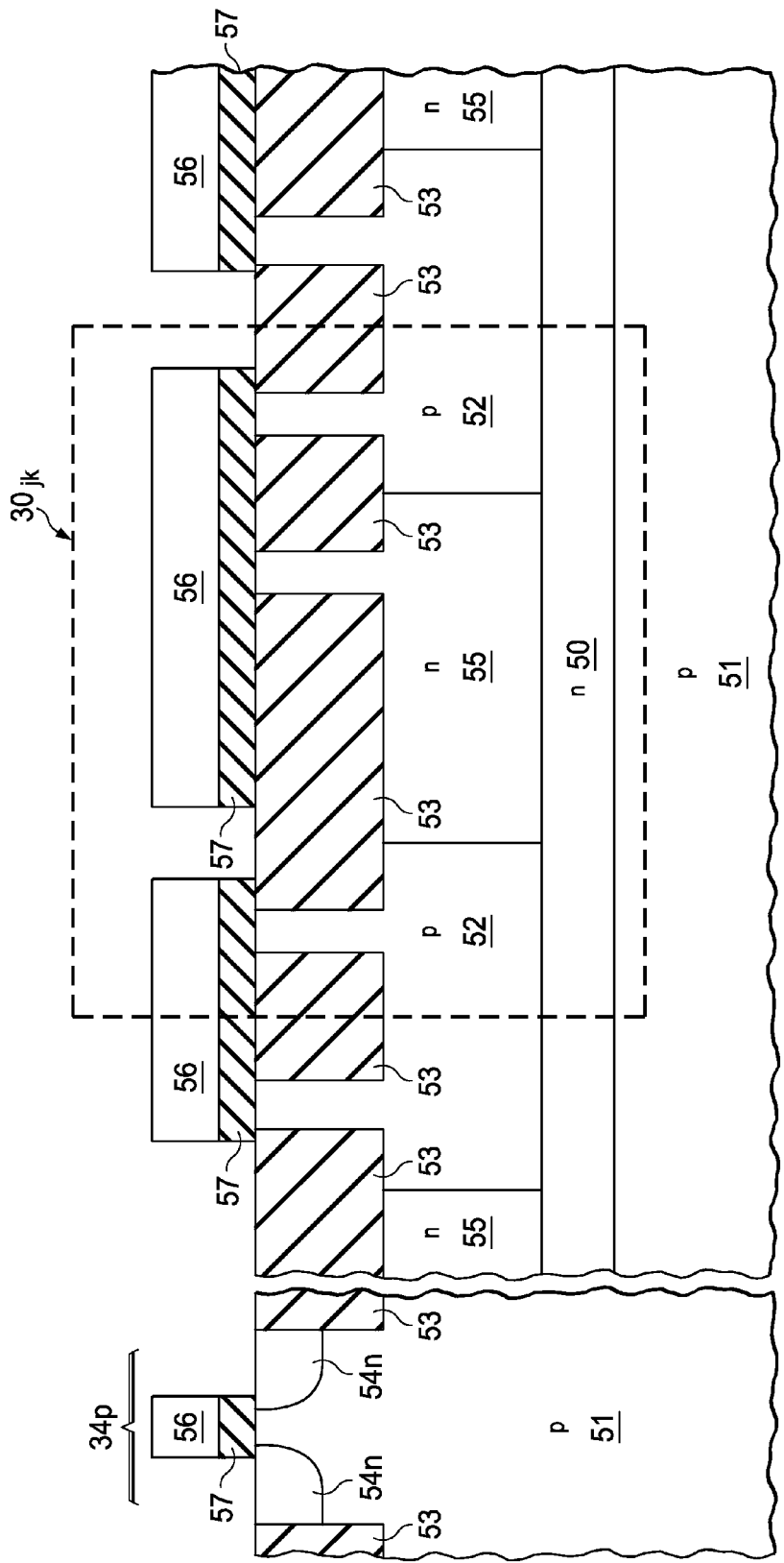

FIG. 6b is a plan view, and FIGS. 6c and 6d are cross-sectional views, of an example of the layout of memory cell $30_{jk}$ at the surface of a silicon substrate, fabricated according to a twin-well CMOS technology and according to an embodiment of this invention, and at a stage in the manufacture prior to the formation of overlying metal layers. In this example, active regions 54 are locations of the surface of an n-well or a p-well, as the case may be, at which dielectric isolation structures 53 are not present. As known in the art, isolation dielectric structures 53 are relatively thick structures of silicon dioxide or another dielectric material, intended to isolate transistor source and drain regions in separate transistors from one another. Isolation dielectric structures 53 are typically formed by way of shallow trench isolation (STI) structures in modern high-density integrated circuits, or alternatively by the well-known local oxidation of silicon (LOCOS) process. Also in FIG. 6b, the various n-well and p-well regions of this portion of memory array 40 are indicated. More specifically, instances of p-wells 52 are separated from one another by an instance of n-well 55, and are each separated from other p-wells 52 by other instances of n-wells 55.

As well known in the art, transistors are formed at locations of active regions 54 that underlie gate elements 56. FIG. 6c illustrates, in cross-section, the construction of n-channel MOS driver transistor 34a, by way of example. As shown in FIG. 6c, transistor 34a is constructed at the surface of p-well 52, at a location at which gate element 56 (extending into and out of the page) crosses active region 54. Gate element 56 is separated from the surface of active region 54 by gate dielectric layer 57 as shown. N+ regions 54n are formed into the surface of active region 54 in the conventional self-aligned manner, by way of ion implantation and a subsequent activation anneal. If desired, sidewall dielectric filaments 59 may be formed on the sides of gate element 56, such sidewall filaments 59 used to separate the reach of separate source/drain ion implantation processes, to create graded junction ("lightly-doped drain") extensions of source/drain regions 54n. The portion of p-well 52 underlying gate element 56, and not doped by the source/drain implant and anneal, remains p-type and will serve as the channel region (i.e., body node) of transistor 34a.

Various materials may be used for gate element 56 and gate dielectric 57. Commonly used materials include polycrystalline silicon for gate element 56, and silicon dioxide or silicon nitride (or a combination of the two) for gate dielectric 57. Those conventional materials are suitable for use with embodiments of this invention. As mentioned above, however, silicon dioxide is becoming unsuitable for use in the deep sub-micron regime; high-k dielectric materials such as hafnium oxide ($HfO_2$) enable a thicker gate dielectric film (as suggested by gate dielectric 57 of FIG. 6c). Similarly, high-performance transistors required in modern integrated circuits now favor the use of metals or metal compounds for gate element 56, examples of which include titanium nitride, tantalum silicon nitride, and tantalum carbide. Other examples of these high-k gate dielectric materials and metal gate materials are known in the art. It is contemplated that embodiments of this invention are especially well-suited for use in connection with such modern transistor materials, particularly considering that the threshold voltages of high-k, metal-gate, transistors has been observed to be relatively insensitive to body node bias. As such, according to embodiments of this invention, little performance change is expected from transistor 34a, implemented as a high-k, metal-gate, transistor with its body node at electrically floating p-well 52.

FIG. 6b illustrates the locations of contact openings 58 that extend through overlying insulator material (not shown) to active regions 54 or to gate elements 56, at the case may be. Metal conductors (two of which are shown schematically in FIG. 6b for storage nodes SNT, SNB) will be patterned to form conductors that overlie the structure, making contact to active regions 54 or gate elements 56 (or both) via respective contact openings 58. More specifically, metal conductors serving as signal conductors will physically contact active regions 54 defining bit lines $BLT_k$, $BLB_k$, and storage nodes SNT, SNB. Signal conductors will also physically contact gate structures 56 serving as storage nodes SNT, SNB, and word line $WL_j$. Metal conductors serving as bias conductors will contact active regions 54 to apply power supply voltage $V_{dda}$ and ground voltage $V_{ssa}$. More specifically, as evident from the combination of FIGS. 6b and 6c, such a bias conductor will contact an instance of n+ active region 54 within p-well 52 to provide ground voltage $V_{ssa}$. Similarly, such a bias conductor would contact an instance of p+ active region 54 within n-well 55 to provide power supply voltage $V_{dda}$.

FIG. 6b also illustrates the outline of the various transistors 33, 34, 35 within cell $30_{j,k}$, corresponding to the electrical schematic of FIG. 6a. As is fundamental in the art, MOS transistors are located at regions of the surface at which a gate element 56 overlies an instance of active region 54. It is contemplated that those skilled in the art will be able to follow the schematic of FIG. 6a within the layout of FIG. 6b with reference to the identification of transistors 33, 34, 35 in FIG. 6a. For example, the metal conductor schematically shown as storage node SNB connects active region 54 at the drain of transistor 34b and one side of pass transistor 35b to active region 54 at the drain of transistor 33b and to gate element 56 serving as the gate of transistors 33a, 34a (via a shared contact opening 58). Similarly, the metal conductor schematically shown as storage node SNT connects active region 54 between transistors 34a, 35a to active region 54 at the drain of transistor 33a, and (via shared contact opening 58) to gate element 56 serving as the gates of transistors 33b, 34b. Power supply and ground voltages $V_{dda}$, $V_{ssa}$, and bit lines $BLT_k$, $BLB_k$, and word line $WL_j$ are connected, via metal conductors (not shown) and contact openings 58 to the appropriate elements within cell $30_{j,k}$ as shown in FIG. 6b, according to the electrical schematic of FIG. 6a.

As described above, and in this twin-well example, n-channel transistors 34a, 35a, and transistors 34b, 35b of cell $30_{j,k}$ are formed in p-wells 52. Similarly, p-channel transistors 33a, 33b are formed in n-well 55. FIG. 6d illustrates, in cross-section, the construction of a portion of memory array 40 in integrated circuit 25, at which SRAM cell $30_{j,k}$ is realized, and illustrating the arrangement of p-wells 52 and n-wells 55. As shown in FIG. 6d, deep n-well 50 is formed within p-type substrate 51, at a location underlying SRAM cell $30_{j,k}$. Deep n-well 50 extends, in unitary fashion, under the entirety of memory array 40 in this embodiment of the invention. P-channel transistors in SRAM cells 30 are formed within corresponding n-wells 55, which extend from the surface of the structure to reach deep n-well 50. By extending to deep n-well 50, n-type silicon effectively surrounds islands of p-type substrate 51 on all sides and on the bottom, defining p-wells 52 as shown in FIG. 6d. The p-type dopant concentration in these isolated p-wells 52 is essentially the same as p-type substrate 51 in this embodiment of the invention, as p-wells 52 are simply regions of substrate 51 that are "walled-off" by deep n-well 50 and n-wells 55.

Deep n-well 50 can also serve to connect all n-wells 55 in memory array 40. As a result, the interconnected n-type structure of n-wells 55 and deep n-well 50 can serve as a plate of a distributed decoupling capacitor, opposing plates of which are at a steady-state voltage (voltages $V_{dda}$, $V_{ssa}$, driven states at storage nodes SNT, SNB, etc.). This decoupling capacitor improves the resistance of n-wells 55 to noise injection and particle strikes, further improving the latchup performance of integrated circuit 25 despite the absence of well contacts within memory array 40.

As shown in FIG. 6d in this embodiment of the invention, deep n-well 50 need not be formed over the entire chip area of integrated circuit 25. As such, peripheral n-channel transistors such as transistor 34p shown in FIG. 6d may be formed at the surface of p-type substrate 51. It is contemplated that n-channel transistors in the peripheral circuits (i.e., decoders, sense amplifiers, write circuits, precharge circuits, etc.) to memory array 40 in RAM 38 can be constructed similarly to transistor 34p, thus receiving the nominal body node bias. Alternatively, these periphery circuit transistors may be constructed within additional instances of p-wells 52.

In manufacture, deep n-well 50 may be formed in the conventional manner for "diffusion-under-field" (or "DUF") structures in integrated circuits, such as by way of a masked ion implant of sufficient dose and energy to place the dopant ions at the desired depth, followed by an anneal to diffuse the implanted dopant as desired. Other methods for forming such buried doped regions, such as used in conventional bipolar manufacturing flows, may alternatively be used.

Figure 6E:
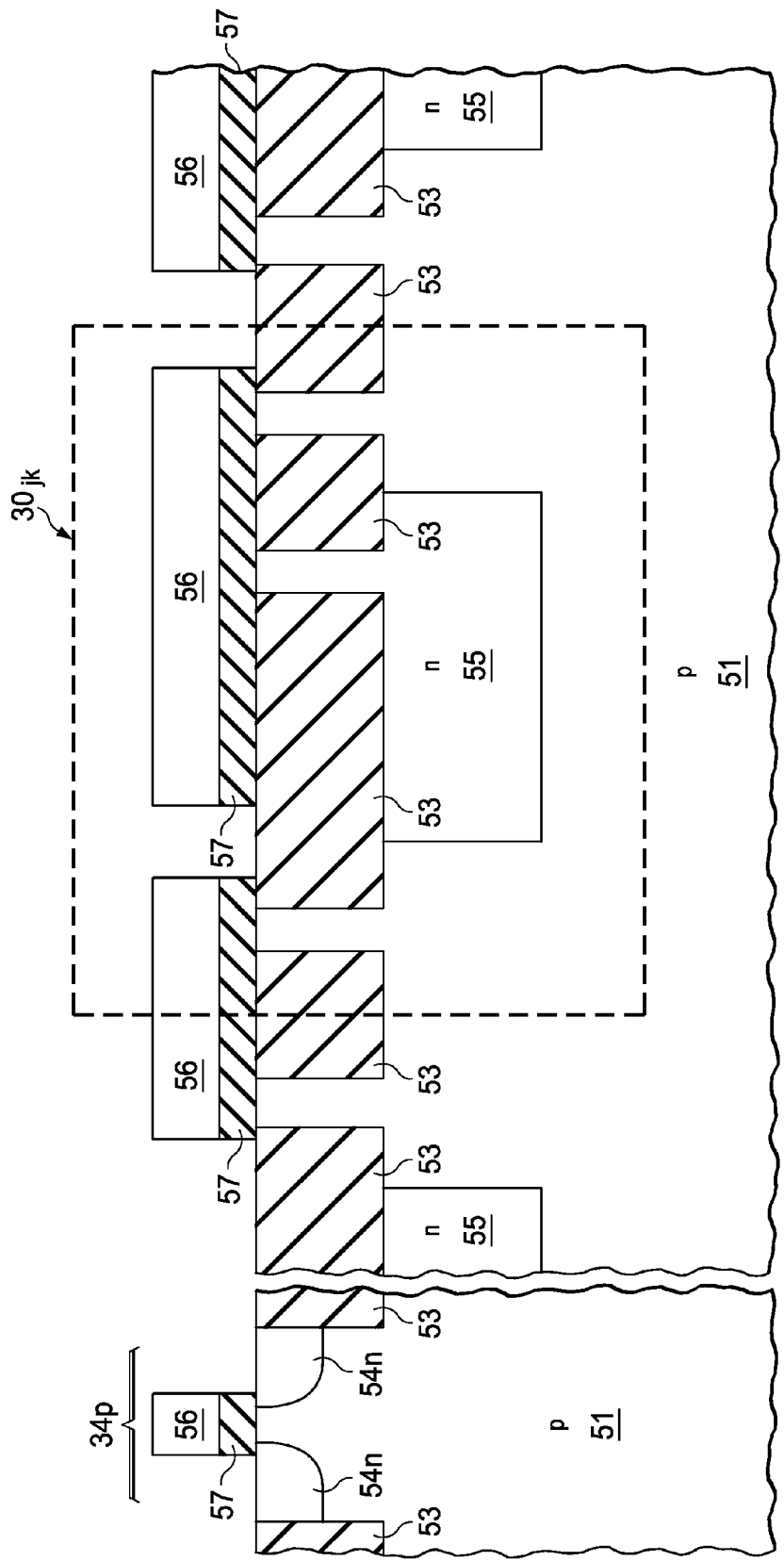

FIG. 6e illustrates, in cross-section and along the same view as that shown in FIG. 6d, the construction of this portion of memory array 40 according to an alternative single-well implementation. Similar structures as those shown in FIG. 6d are indicated by the same reference numerals. In this embodiment of the invention, separate p-wells 52 are not constructed. Rather, n-channel MOS transistors 34, 35, are formed at surface locations of p-type substrate 51. P-channel MOS transistors 33 are formed at surface locations of n-well 55, as before. In this implementation, as discussed above, the voltage to which substrate 51 is biased at other locations (not shown) of integrated circuit 25 will appear at the body nodes of n-channel transistors 34, 35 in cell $30_{j,k}$. However, no substrate contact (p+ region formed into the surface of substrate 51) will be formed within the bounds of memory array 40, and indeed no such substrate contact is necessary.

Referring to FIGS. 6a through 6e in combination, therefore, SRAM cell $30_{j,k}$ is formed into the surface of p-type substrate 51, into which one or more n-wells 55 have been formed, within which p-channel MOS transistors 33a, 33b of cell $30_{j,k}$ are formed. In some embodiments, p-wells 52 and deep n-well 50 are also formed into substrate 51, with n-channel MOS transistors 34a, 35a, 34b, 35b formed into one or more instances of those p-wells 52. In other embodiments, those n-channel MOS transistors 34, 35 are formed at surface locations of substrate 51. As will become evident from the following description, adjacent cells 30 can be formed on all four sides of cell $30_{j,k}$. The planar transistor configurations shown in FIGS. 6c through 6e are provided by way of example only, as it is contemplated that embodiments of this invention can be applied to configurations of other transistor types, such as tri-gate and FinFET transistors.

Figure 6F:
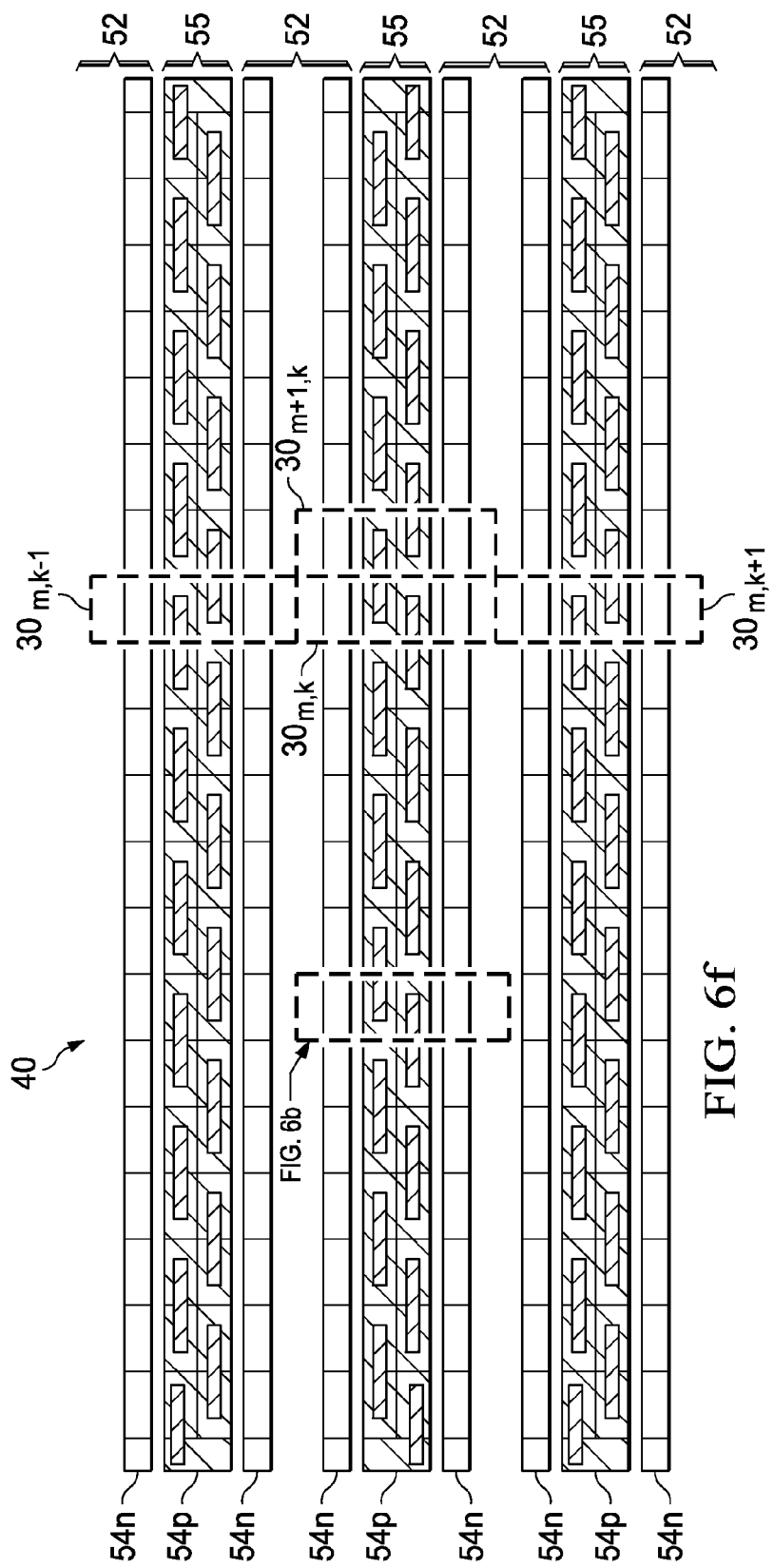
FIGS. 6f and 6g are plan views of a portion of a memory array in the memory of FIG. 5 according to embodiments of this invention.

FIG. 6f illustrates, in plan view, a larger portion of memory array 40 than that shown in FIG. 6b, but showing only active regions 54p, 54n (which are p-type and n-type, respectively), p-wells 52, and n-wells 55; other levels are not shown in FIG. 6f for the sake of clarity. The portion shown in FIG. 6b is highlighted by dashed lines in FIG. 6f. As evident from FIG. 6f, each of p-wells 52 extends laterally (in the view of FIG. 6f) for some distance, encompassing several memory cells 30. The orientation of the plan view of FIG. 6f is such that columns run horizontally and rows run vertically. For example, SRAM cell $30_{m,k}$ in row m and column k is highlighted. Above and below SRAM cell $30_{m,k}$ are cells $30_{m,k-1}$, $30_{m,k+1}$, which also reside in the same row m but in columns k−1 and k+1, respectively. SRAM cell $30_{m+1,k}$ is along the right-hand side of cell $30_{m,k}$, residing in the same column k but in neighboring row m+1.

The portion of memory array 40 shown in FIG. 6f repeats, for the desired number of cells 30, over the entirety of the area of memory array 40. At the edges of memory array 40, these structures (including, of course, gate elements 56) are repeated for dummy memory cells which, as described above, absorb photolithographic non-uniformity that may be caused by the differently shaped structures of integrated circuit 25 adjacent to memory array 40. As evident from FIG. 6f, active regions 54n disposed within p-type wells 52 within the bounds of memory array 40 are only n-type, and active regions 54p disposed within n-type wells 55 within the bounds of memory array 40 are only p-type. Stated another way, according to embodiments of this invention, no n+ region to which a bias conductor (e.g., power supply voltage $V_{dda}$, ground voltage $V_{ssa}$) is in physical contact are disposed within any instance of n-wells 55 within memory array 40, and no p+ region to which a bias conductor is in physical contact is disposed within any instance of p-wells 52 within memory array 40.

Figure 6G:
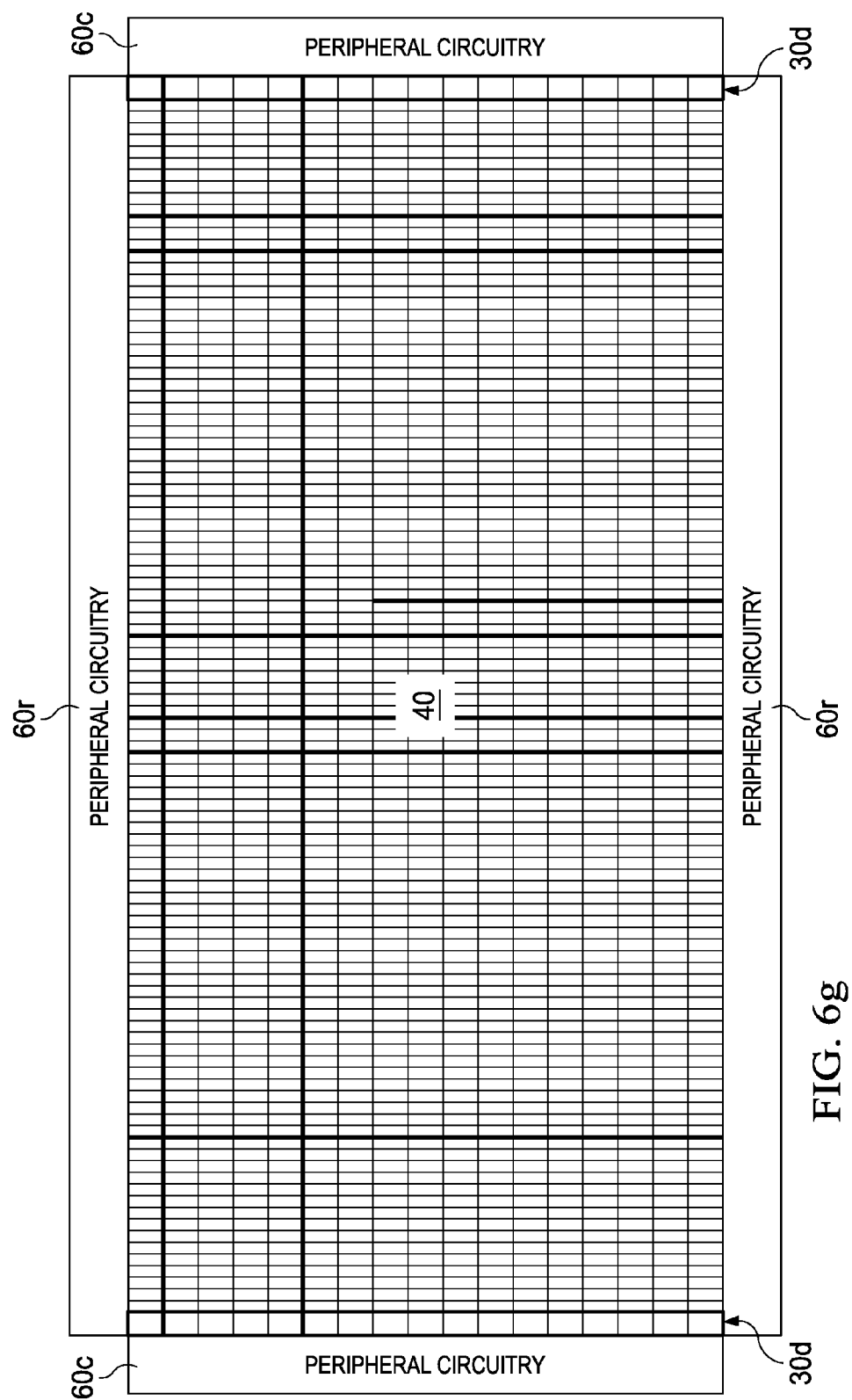

FIG. 6g illustrates, in plan view, the entirety of memory array 40 constructed according to embodiments of this invention. Memory array 40 in this view is oriented similarly as that shown in FIGS. 6b, and 6f, such that memory rows run vertically and columns run horizontally in this view. As shown in FIG. 6g, peripheral circuitry 60C is located adjacent to memory array 40 on both of its left and right sides, in the view of FIG. 6g; because of its location on the ends of columns of cells 30, peripheral circuitry 60C is contemplated to include such circuits as column select circuits 42, read/write circuits 44, bit line precharge circuitry 47, and the like. Peripheral circuitry 60R is located adjacent to memory array 40 on both of its top and bottom sides, the view of FIG. 6g; because of its location on the ends of rows of cells 30, peripheral circuitry 60R is contemplated to include such circuits as row decoder 45 and the like.

Figure 3:
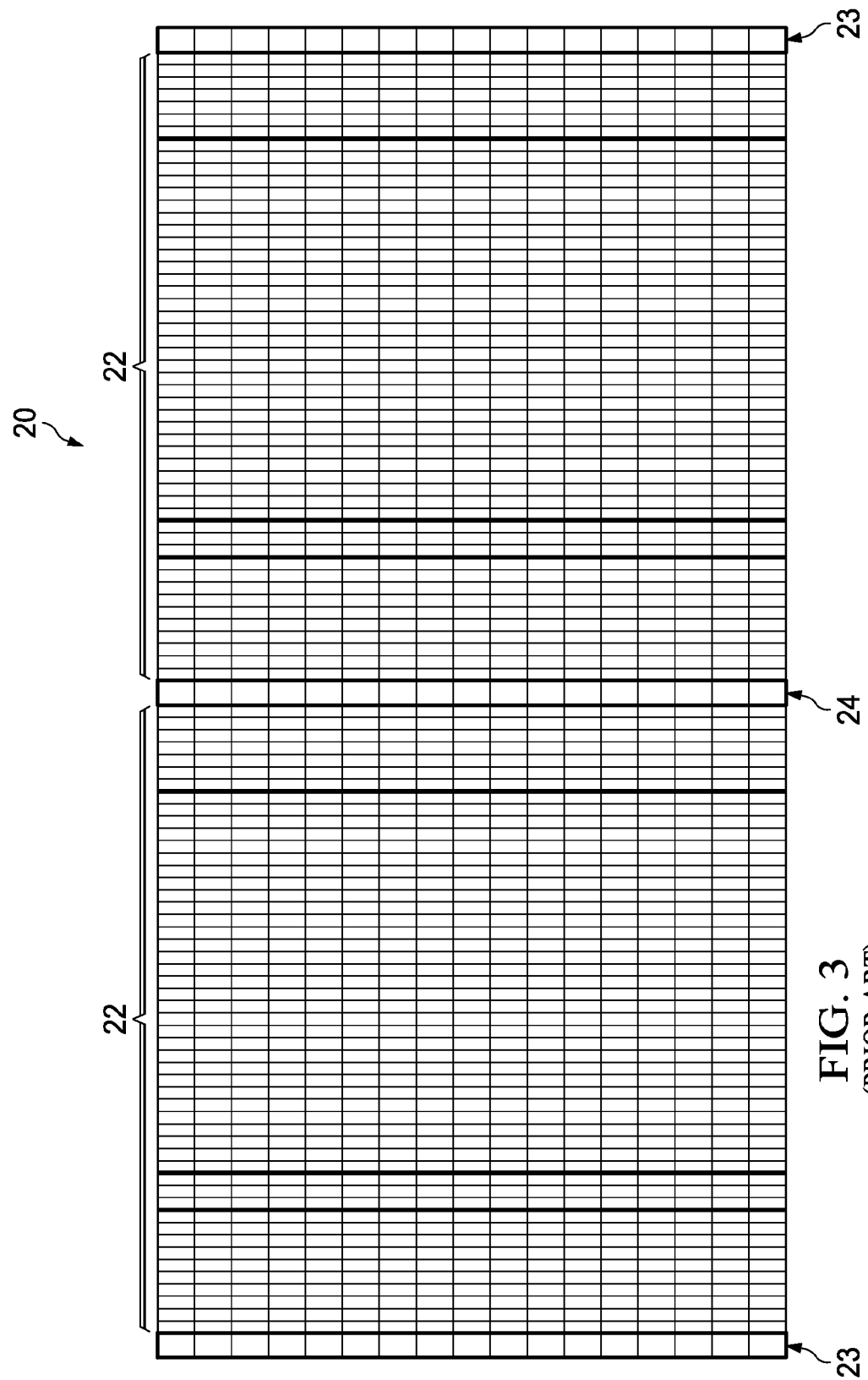
FIG. 3 is a plan view of a conventional memory array.

As evident from FIG. 6g, memory array 40 includes only cells 30 and dummy edge cells 30d (which, in this example, are disposed at the ends of columns of array 40, adjacent to peripheral circuitry 60C). No chip area within memory array 40 need be provided for well contacts, as in conventional array layouts such as shown in FIG. 3 discussed above. Furthermore, the area required for dummy edge cells 30d need not also account for well contacts, as often is the case in conventional memory arrays. And as discussed above, the chip area saved can be substantial, as much as 3% or more, especially at more aggressive technology nodes. These savings in chip area are attained without increasing vulnerability of integrated circuit 25, based on the observations and discoveries regarding reduced vulnerability to latchup of memory cells constructed at advanced technology nodes. And in implementations in which high-k, metal-gate, transistors are used to realize cells 30, electrically floating wells and thus transistor body nodes do not significantly affect device performance.

Another benefit of electrically floating n-wells in a CMOS integrated circuits, such as within memory array 40 described above, is a corresponding improvement in gate-induced diode leakage (including both gate-edge diode leakage and also junction leakage). As known in the art, diode junction leakage increases exponentially with the reverse-bias voltage across that junction. By allowing electrically floating wells, or at least attenuated contact of transistor body nodes to a bias voltage, this leakage mechanism becomes much less significant. Reduction in leakage current is especially important in CMOS SRAM devices, particularly those with minimum feature size transistors, as known in the art. Embodiments of this invention thus help to address this issue.

Of course, the construction of memory array 40 shown in FIGS. 6a through 6g is presented by way of example only, it being understood that the particular layout of SRAM cell $30_{jk}$ and memory array 40 can vary from that shown, depending on the particular manufacturing technology and design rules applicable to each implementation, and on the layout optimization arrived at by those skilled in that art.

Figure 7:
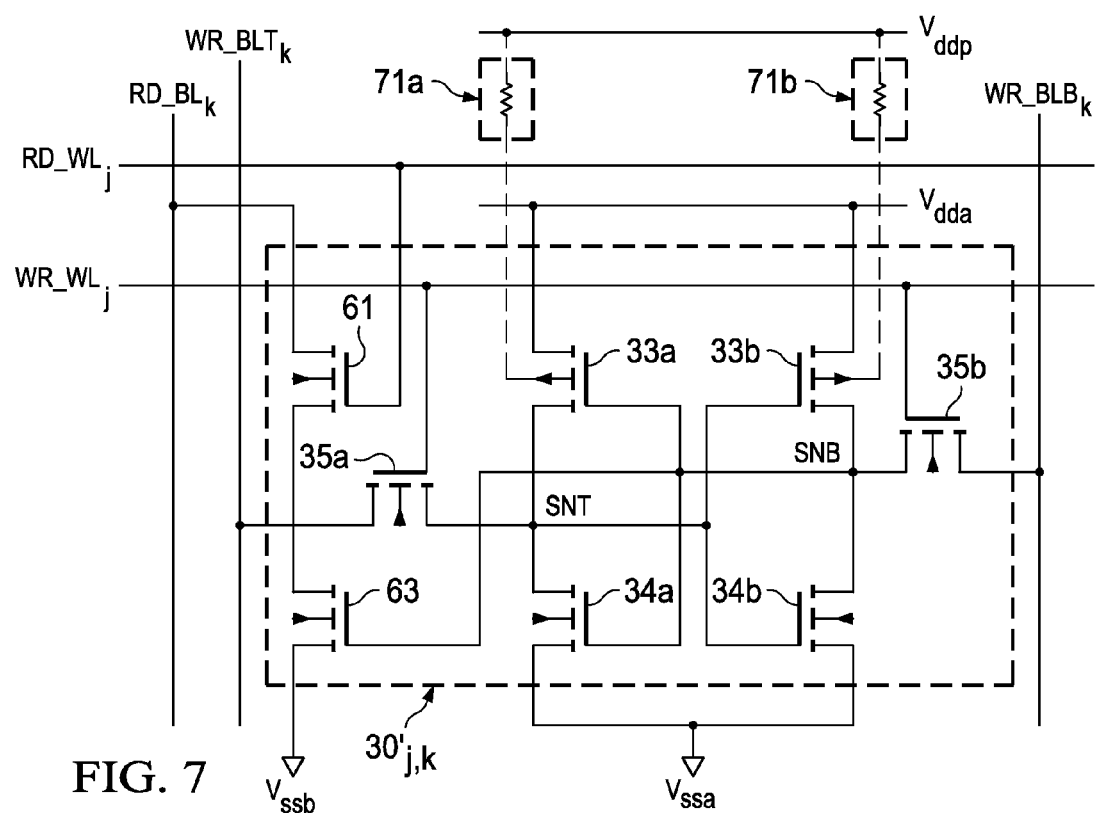
FIG. 7 is an electrical diagram, in schematic form, of an 8-T SRAM cell according to embodiments of this invention.

FIG. 7 schematically illustrates the construction of memory cell $30'_{j,k}$ according to an alternative embodiment of the invention. Cell $30'_{j,k}$ adds a two-transistor buffer to the 6-T construction described above in connection with FIG. 6a. In this example, "8-T" SRAM cell $30'_{j,k}$ includes a single-sided read buffer constructed of n-channel channel MOS transistors 61, 63 with their source/drain paths connected in series between read bit line RD_BL$_k$ for column k in which cell $30'_{j,k}$ resides, and a ground voltage $V_{ssb}$ (which may be at the same or a different voltage from array ground voltage $V_{ssa}$). The gate of transistor 63 is connected to storage node SNB, while the gate of transistor 61 is connected to read word line RD_WL$_j$, which is the word line asserted in read cycles for row j in which cell $30'_{j,k}$ resides. Conversely, the gates of pass transistors 35a, 35b of cell $30'_{j,k}$ are connected to write word line WR_WL$_j$, and the source/drain paths of pass transistors 5a, 5b are connected between their respective storage nodes SNT, SNB, and write bit lines WR_BLT$_k$, WR_BLB$_k$, respectively. As such, the state of cell $30'_{j,k}$ appears at read bit line RD_BL$_k$ in a read cycle selecting cell $30'_{j,k}$, and is written from write bit lines WR_BLT$_k$, WR_BLB$_k$ in a write cycle selecting cell $30'_{j,k}$.

In this construction, p-channel load transistors 33a, 33b may be constructed within an n-well that is electrically floating, as described above in connection with cell $30_{j,k}$. Alternatively, and as suggested in FIG. 7, that n-well, and thus the body nodes of p-channel transistors 33a, 33b, may instead be biased by a bias conductor to a power supply voltage $V_{ddp}$, where the location of the n-well physically contacted by that bias conductor is outside of the bounds of memory array 40. This n-well bias point is quite distant from the body nodes of transistors 33a, 33b in a given cell $30'_{j,k}$, as indicated by respective resistors 71a, 71b shown in FIG. 7. According to embodiments of this invention, the location at which the bias conductor makes contact to the n-well of transistors 33a, 33b is within the peripheral circuitry adjacent to memory array 40. As such, the schematic shown in FIG. 7 shows this body node bias as peripheral power supply voltage $V_{ddp}$.

Figure 8:
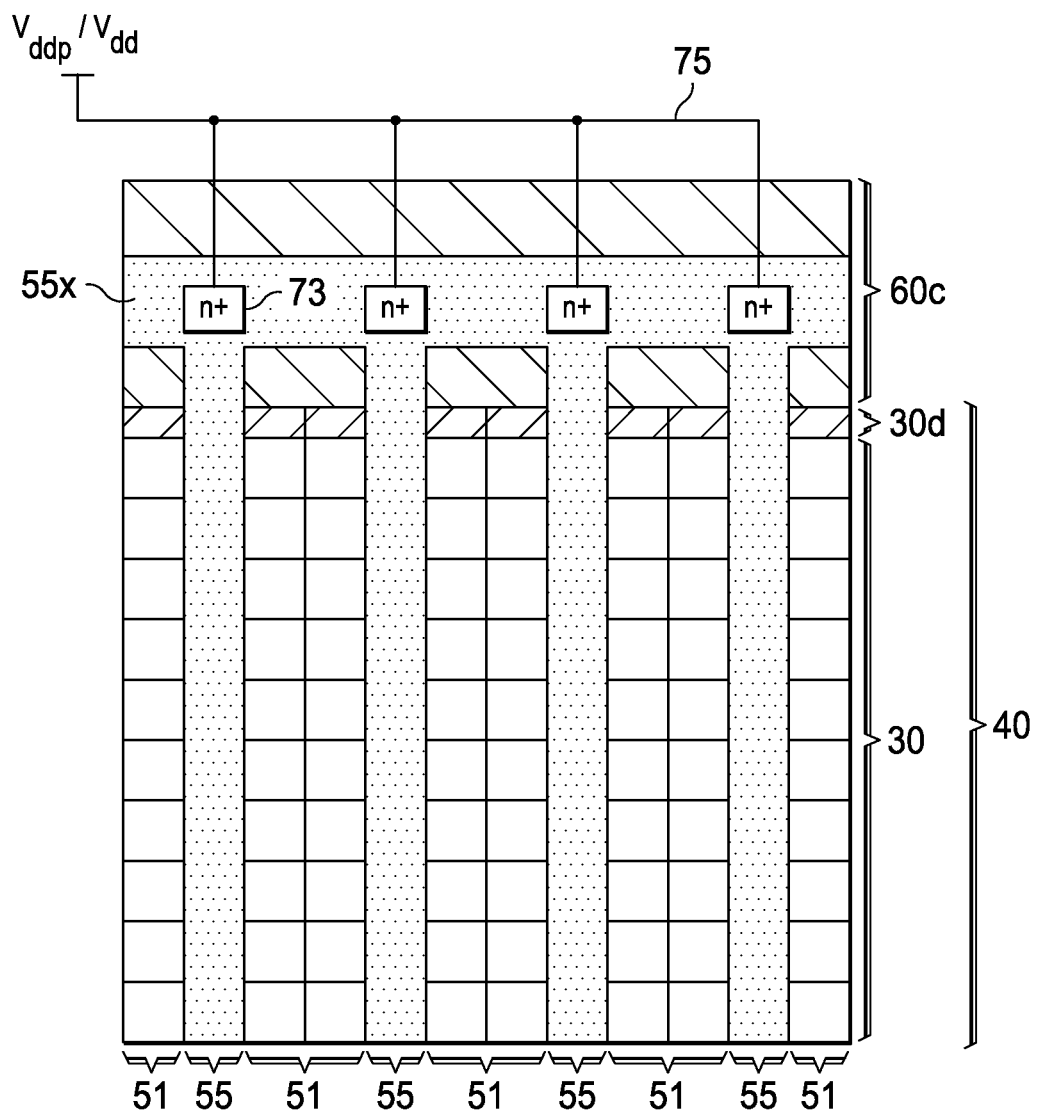
FIG. 8 is a plan view of a portion of an integrated circuit according to another embodiment of the invention.

FIG. 8 illustrates, in plan view, a portion of the layout of RAM 38 at the edge of memory array 40, adjacent to peripheral circuitry 60C. As shown in FIG. 8, instances of n-wells 55 extend beyond the bounds of the area of memory array 40 (i.e., to and past dummy edge cells 30d), and connect with one another at an n-well extension 55x that is located within the area of peripheral circuitry 60C. In this embodiment of the invention, multiple n+ well contact regions 73 are provided within this n-well extension 55x, serving as well contact regions. Bias conductors 75 physically contact these n+ well contact regions 73 in the conventional fashion, and thus bias n-wells 55 to a power supply voltage. In this example, the power supply voltage biasing n-wells 55 is a relatively high voltage, such as a power supply voltage $V_{dd}$. This power supply voltage may be the same voltage as that biasing cells 30 in memory array 40, namely power supply voltage $V_{dda}$. Alternatively, n-well extension 55x can also serve as an n-well for p-channel MOS transistors in peripheral circuitry 60C, in which case bias conductors 75 would bias n-wells 55 to the same well bias voltage for both memory array 40 and peripheral circuitry 60C. For example, peripheral power supply voltage $V_{ddp}$ may be applied to n-wells 55, so long as voltage $V_{ddp}$ is no further below array power supply voltage $V_{dda}$ than a diode threshold voltage; typically, peripheral power supply voltage $V_{ddp}$ is higher than array power supply voltage $V_{dda}$ considering that peripheral circuitry transistors are typically larger than cell transistors. Sharing of n-wells 55 between cells 30 and peripheral circuitry 60C, in which n+ well contact regions 73 are disposed within the bounds of peripheral circuitry 60C, reduces the chip area required for this contact and maintains minimum chip area for memory array 40.

Referring back to FIG. 7, resistors 71a, 71b represent the parasitic resistance of n-wells 55, which are typically relatively lightly-doped, between n+ well contact regions 73 and cell 30'$_{j,k}$ in memory array 40. Little or no DC bias current is conducted by n-wells 55 in normal operation, and as such only an insignificant voltage drop will be present across parasitic resistors 71a, 71b. And, as discussed above, because it has been discovered, in connection with this invention, that modern sub-micron SRAM cells 30 are relatively invulnerable to latchup, the more resistive path of well bias is well tolerated in modern integrated circuits.

While the example of FIG. 8 illustrates the biasing of only n-wells 55, it is contemplated that p-type wells (not shown) present in memory array 40 may similarly have extensions into peripheral circuitry 60C, 60R, and be similarly biased to a ground voltage at p+ well contact regions to those extensions at locations within peripheral circuitry 60C, 60R. And while the example of FIG. 8 illustrates well extension 55x as extending into column peripheral circuitry 60C, those well extensions 55x may instead or additionally extend into row peripheral circuitry 60R. Furthermore, the embodiment of the invention illustrated in FIG. 8 may be applied to either 6-T cells such as cell 30$_{j,k}$ of FIG. 6a, or to 8-T cells such as cell 30'$_{j,k}$ of FIG. 7, as well as to 10-T cells and other variations of memory cells.

Figure 9:
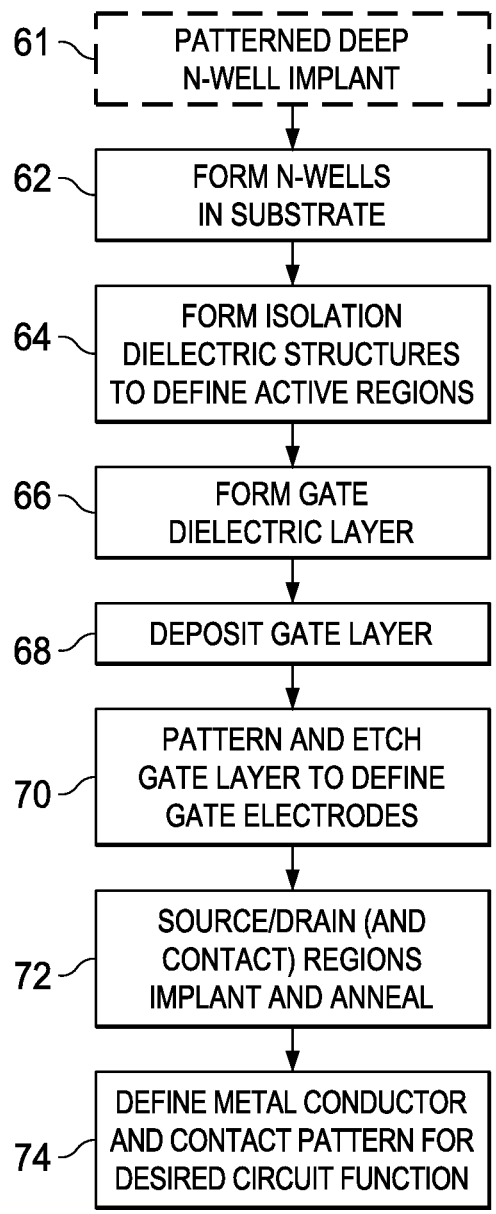
FIG. 9 is a flow diagram illustrating a manufacturing process flow for fabricating an integrated circuit according to embodiments of the invention.

Referring now to FIG. 9, a generalized manufacturing process flow for the fabrication of integrated circuit 25 including memory array 40 and its peripheral circuitry 60R, 60C according to CMOS technology. Of course, variations in the construction of integrated circuit 25, including additional or different process steps and different orders of performing those processes, will be known to those skilled in the art having reference to this specification, and are contemplated to be within the scope of this invention as claimed.

In this example, actual physical fabrication of the integrated circuit begins with the formation of the various wells in substrate 51 of a single-crystal silicon wafer of the desired conductivity type and dopant concentration, of a single-crystal layer of silicon overlying an insulator layer disposed on a handle wafer (according to conventional silicon-on-insulator technology), or of an alternative starting material to these typical substrate structures. Optional process 61 of FIG. 9 is a masked deep n-well ion implant for forming deep n-well 50 (FIG. 6d). Process 61 will thus implant the appropriate donor species at the appropriate dose and energy, at the desired locations, to form the desired structure. In process 62, n-wells 55 are defined in the conventional manner at selected locations of the surface of substrate 51, again by way of a masked ion implant. For a double-well process in which deep n-well 50 is not formed, or if the dopant concentration of substrate 51 is not suitable for use as a p-well, p-type wells 52 would be similarly formed, but at locations different from those of n-wells 55. In process 64, isolation dielectric structures 53 are formed at selected locations of the surface of substrate 51 and its wells 52, 55. In modern integrated circuits, these isolation dielectric structures 53 are formed using shallow trench isolation techniques; alternatively, local oxidation of silicon (LOCOS) isolation oxide can be thermally formed. As known in the art, those "moat" locations of the surface of substrate 51 and its wells 52, 55 at which isolation dielectric structures 53 are not formed will become the active regions at which transistors will eventually be formed.

In process 66, gate dielectric layer 57 is formed over the active regions defined by isolation dielectric structures 53. This gate dielectric layer may be silicon dioxide, formed by thermal oxidation of the exposed silicon in these active regions or by deposition, deposited silicon nitride, a combination or stack of silicon dioxide and silicon nitride, or such other transistor gate dielectric material as known in the MOS transistor art. For example, as described above, embodiments of this invention are especially well-suited for use in memories constructed according to a high-k, metal-gate technology, in which case gate dielectric layer 57 is constructed from a high-k material such as $HfO_2$. Gate layer 58 is then deposited overall, in process 68, and consists of the desired polysilicon or metal material from which gate electrodes and gate-level interconnects are defined at the desired locations by photolithographic pattern and etch process 70, according to the appropriate technology (e.g., including resolution enhancement technology, sub-resolution assist photomask features, etc.).

Ion implant and anneal process 72 is then performed to form heavily-doped source and drain regions for transistors, and doped regions for well contacts, of both conductivity types in this CMOS manufacturing process. As typical in the art, the implant forming source/drain regions is performed in a self-aligned manner relative to gate electrodes 58 defined in processes 68, 70. Lightly-doped drain extensions may be formed within process 72, in the conventional manner by forming sidewall dielectric spacers following a first source/drain implant, as is well-known. As described above, source and drain regions are formed by heavily-doped regions of a conductivity type opposite to that of the substrate or well at which those regions are formed, while well contacts are formed by heavily-doped regions of the same conductivity type as the substrate or well at which they are formed. According to embodiments of this invention, no well contacts are provided within the bounds of memory array 40, as described above.

In this example of the fabrication of integrated circuit 25, as shown in FIG. 9, conventional additional processing is then performed after formation of the gate level conductors in process 74. This process 74 specifically includes the formation of contact openings through overlying insulator layers to contact the source and drain regions, and gate electrodes, of transistors within memory array 40 and elsewhere in integrated circuit 25, and to contact n-well and p-well structures outside of the bounds of memory array 40. Process 74 also includes the deposition and patterning of the desired metal conductor routing into those contact openings. Other processes useful in the fabrication of actual integrated circuits, as known in the art, will be performed at the appropriate stages in this fabrication flow, as known by those skilled in the art having reference to this specification, such other processes culminating in the electrical test and packaging of integrate circuit 25 for use in its desired end system.

Embodiments of this invention provide an integrated circuit including a memory array, and methods of operating and fabricating the same, in which the necessary chip area required for implementation of the memory array is reduced without increasing the risk of failures due to latchup, and without significantly affecting the electrical performance of transistors in the memory cells of that array. Embodiments of this invention further reduce leakage current due to gate-induced diode leakage, and in some cases providing the beneficial by-product of a distributed decoupling capacitor that improves latchup tolerance of the resulting integrated circuit.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A solid-state memory in an integrated circuit formed at a semiconducting surface of a body, the memory comprising:
   a plurality of memory cells arranged in rows and columns within a generally rectangular bit array area of the semiconducting surface, each memory cell including two or more transistors, each having a channel region disposed in a first well region of the semiconducting surface doped to a first conductivity type;
   one or more bias conductors for applying a bias voltage routed within the bit array area, each physically contacting a doped region in one or more of the memory cells;
   one or more signal conductors routed within the bit array area, each physically contacting a doped region in one or more of the memory cells; and
   peripheral circuitry disposed in a peripheral area adjacent to the bit array area and coupled to the one or more signal conductors;
   wherein, within the bit array area, doped regions only of a second conductivity type, opposite the first conductivity type, are disposed within the first well region and are physically contacted by one of the bias conductors.

2. The memory of claim 1, wherein the first well region has a portion extending beyond the bit array area into the peripheral area;
   and further comprising:
      a doped region of the first conductivity type formed into the first well region at its portion extending into the peripheral area and physically contacted by one of the bias conductors.

3. The memory of claim 1, wherein the first well region has a portion extending beyond the bit array area into the peripheral area;
   and further comprising:
      one or more periphery bias conductors for applying bias voltage, routed within the peripheral area and physically contacting one or more doped regions in the periphery circuitry; and
      a doped region of the first conductivity type formed into the first well region at its portion extending into the peripheral area and physically contacted by one of the periphery bias conductors.

4. The memory of claim 1, wherein the first well region includes no doped region of the first conductivity type that is physically contacted by one of the bias conductors.

5. The memory of claim 4, wherein, during operation of the memory, the first well region is electrically floating.

6. The memory of claim 1, wherein each memory cell further includes two or more transistors, each having a channel region disposed in a second well region of the semiconducting surface doped to the second conductivity type;
   and wherein within the bit array area, doped regions only of the first conductivity type are disposed within the second well region and are physically contacted by one of the bias conductors.

7. The memory of claim 6, wherein the second well region has a portion extending beyond the bit array area into the peripheral area;
   and further comprising:
      a doped region of the second conductivity type formed into the second well region at its portion extending into the peripheral area and physically contacted by one of the bias conductors.

8. The memory of claim 6, wherein the second well region has a portion extending beyond the bit array area into the peripheral area;
   and further comprising:
      one or more periphery bias conductors for applying bias voltage, routed within the peripheral area and physically contacting one or more doped regions in the periphery circuitry; and
      a doped region of the second conductivity type formed into the second well region at its portion extending into the peripheral area and physically contacted by one of the periphery bias conductors.

9. The memory of claim 6, wherein the second well region includes no doped region of the second conductivity type that is physically contacted by one of the bias conductors, whereby, during operation of the memory, the second well region is electrically floating.

10. The memory of claim 6, wherein the first well region includes no doped region of the first conductivity type that is physically contacted by one of the bias conductors, whereby, during operation of the memory, the second well region is electrically floating;
    and further comprising:
       a deep well region of the second conductivity type, in contact with the second well region, and underlying the first well region.

11. The memory of claim 1, wherein the first well region includes two or more transistors of a column of memory cells;
    and further comprising:
       a plurality of well regions of the first conductivity type, each including two or more transistors of a column of memory cells.

12. The memory of claim 11, wherein each of a plurality of the memory cells comprises:
    first and second cross-coupled inverters, each comprising a p-channel field-effect transistor and an n-channel field effect transistor, the p-channel transistors each having a channel region disposed in one of the well regions of the first conductivity type, each inverter having an output, and each inverter having an input coupled to the output of the other inverter; and
    first and second pass transistors, each having a source/drain path coupled between an output of a corresponding one of the first and second inverters and a bit line for the column, and having a gate electrode coupled to a word line.

13. The memory of claim 11, wherein each of the memory cells comprises:
    first and second cross-coupled inverters, each comprising a p-channel field-effect transistor and an n-channel field-effect transistor, the p-channel transistors each having a channel region disposed in one of the well regions of the first conductivity type, each inverter having an output, and each inverter having an input coupled to the output of the other inverter; and
    first and second pass transistors, each having a source/drain path coupled between an output of a corresponding one of the first and second inverters and a write bit line for the column including the memory cell, and having a gate electrode coupled to a write word line for the row including the memory cell;
    a buffer circuit disposed within the bit cell area nearer to the first inverter than to the second inverter, and comprising:

a first buffer transistor having a source/drain path, and having a gate connected to a read word line for the row including the memory cell; and a second buffer transistor having a source/drain path in series with the source/drain path of the first buffer transistor between a read bit line for the column including the memory cell and a reference voltage, and having a gate connected to the output of the second inverter.

14. The memory of claim 1, wherein the first conductivity type is n-type and the second conductivity type is p-type.

15. The memory of claim 14, wherein the body comprises a p-type substrate.

16. A method of operating a solid-state memory in an integrated circuit formed at a semiconducting surface of a body, wherein the memory comprises a plurality of memory cells arranged in rows and columns within a generally rectangular bit array area of the semiconducting surface, each memory cell comprising first and second cross-coupled inverters and a first pass transistor, each column of memory cells associated with a first bit line coupled to the first pass transistor of the memory cells in the column, each row of memory cells associated with a word line coupled to gates of the pass transistors of the memory cells in the row;

wherein each memory cell including two or more transistors, each having a channel region disposed in a first well region of the semiconducting surface doped to a first conductivity type;

the method comprising:

applying a bias voltage to the first and second inverters of a selected memory cell while electrically floating the first well region;

during the applying step, energizing the word line for the row including the selected memory cell; and during the applying step, sensing the state of the bit line of the column including the selected memory cell.

17. The method of claim 16, further comprising:

during the applying step, writing a first data state to the selected memory cell.

18. The method of claim 16, wherein each memory cell further includes two or more MOS transistors, each having a channel region disposed in a second well region of the semiconducting surface doped to a second conductivity type opposite the first conductivity type;

wherein the applying step further comprises applying the bias voltage to the first and second inverters of the selected memory cell while electrically floating the second well region.

19. A method of fabricating a memory in an integrated circuit, comprising the steps of:

forming a first well region of a first conductivity type at a semiconducting surface of a body;

forming gate electrodes in each of a plurality of adjacent bit cell areas in a bit array area of the semiconducting surface, including at locations overlying the first well region;

forming doped regions of a second conductivity type, opposite the first conductivity type, on opposite sides of at least two gate electrodes in the first well region in each bit cell area, to define first and second transistors in a memory cell;

forming doped regions of the first conductivity type on opposite sides of gate electrodes outside of the first well region in each bit cell area, to define one or more additional transistors within each of the bit cell areas;

forming interconnections among the doped regions and gate electrodes of the first and second transistors and additional transistors within each bit cell area to define first and second cross-coupled inverters, the first inverter including the first transistor and the second inverter including the second transistor; and forming bias conductors physically contacting one or more doped regions in the bit cell area;

wherein, within the bit array area, doped regions only of the second conductivity type are disposed within the first well region and are physically contacted by one of the bias conductors.

20. The method of claim 19, wherein the step of forming the first well region forms the first well region to have a portion outside of the bit array area, and extending into a peripheral circuit area of the semiconducting surface;

wherein the step of forming doped regions of the first conductivity type also forms at least one doped region of the first conductivity type at the portion of the first well region in the peripheral circuit area;

and wherein the step of forming bias conductors forms at least one bias conductor physically contacting the at least one doped region of the first conductivity type at the portion of the first well region in the peripheral circuit area.

21. The method of claim 19, wherein the step of forming the first well region forms the first well region to have a portion outside of the bit array area, and extending into a peripheral circuit area of the semiconducting surface;

wherein the step of forming doped regions of the first conductivity type also forms at least one doped region of the first conductivity type at the portion of the first well region in the peripheral circuit area;

and further comprising:

forming one or more peripheral bias conductors physically contacting one or more doped regions in the peripheral circuit area, and contacting the at least one doped region of the first conductivity type at the portion of the first well region in the peripheral circuit area.

22. The method of claim 19, further comprising:

forming a second well region of a second conductivity type at the semiconducting surface and within the bit array area;

wherein the step of forming doped regions of the first conductivity type forms those doped regions within the second well region;

and wherein, within the bit array area, only doped regions of the first conductivity type are disposed within the second well region and are physically contacted by one of the bias conductors.

23. The method of claim 22, wherein the step of forming the second well region forms the second well region to have a portion outside of the bit array area, and extending into the peripheral circuit area;

wherein the step of forming doped regions of the second conductivity type also forms at least one doped region of the second conductivity type at the portion of the second well region in the peripheral circuit area;

and wherein the step of forming bias conductors forms at least one bias conductor physically contacting the at least one doped region of the second conductivity type at the portion of the second well region in the peripheral circuit area.

24. The method of claim 22, wherein the step of forming the first well region forms the first well region to have a portion outside of the bit array area, and extending into a peripheral circuit area of the semiconducting surface;

wherein the step of forming doped regions of the second conductivity type also forms at least one doped region of the second conductivity type at the portion of the second well region in the peripheral circuit area;

and further comprising:

forming one or more peripheral bias conductors physically contacting one or more doped regions in the peripheral circuit area, and contacting the at least one doped region of the second conductivity type at the portion of the second well region in the peripheral circuit area.

25. The method of claim 22, wherein the semiconducting surface is of the first conductivity type;

and further comprising:

forming a deep well region of the second conductivity type at a location of the bit array area underlying the location of the first well region;

wherein the step of forming the second well region forms the second well region to a depth that contacts the deep well region.

* * * * *